US005554862A

United States Patent [19]
Omura et al.

[11] Patent Number: 5,554,862
[45] Date of Patent: Sep. 10, 1996

[54] POWER SEMICONDUCTOR DEVICE

[75] Inventors: Ichiro Omura, Yokohama; Mitsuhiko Kitagawa, Tokyo; Kazuya Nakayama, Sagamihara; Masakazu Yamaguchi, Tokyo, all of Japan

[73] Assignee: Kabushiki Kaisha Toshiba, Kawasaki, Japan

[21] Appl. No.: 183,364

[22] Filed: Jan. 19, 1994

Related U.S. Application Data

[63] Continuation-in-part of Ser. No. 40,595, Mar. 31, 1993, Pat. No. 5,298,769.

[30] Foreign Application Priority Data

Mar. 31, 1992 [JP] Japan .................................. 4-105674
Jan. 20, 1993 [JP] Japan .................................. 5-007415

[51] Int. Cl.$^6$ ............................ H01L 29/74; H01L 31/111
[52] U.S. Cl. .......................... 257/137; 257/133; 257/138; 257/146; 257/163; 257/331; 257/332; 257/378
[58] Field of Search .................................. 257/133, 137, 257/138, 146, 163, 331, 332, 378

[56] References Cited

U.S. PATENT DOCUMENTS 5,304,821 4/1994 Hagino .................................. 257/133
5,329,142 7/1994 Kitagawa et al. ..................... 257/137

Primary Examiner—Ngan V. Ngo
Attorney, Agent, or Firm—Oblon, Spivak, McClelland, Maier & Neustadt, P.C.

[57] ABSTRACT

In a power semiconductor device, an n-base is formed on a p-emitter layer. On the n-base layer, a p-base layer, an n-emitter layer, and a high-concentration p-layer are formed laterally. In the p-base layer, an n-source layer is formed a specified distance apart from the n-emitter layer. In the n-emitter layer, a p-source layer is formed a specified distance apart from the high-concentration p-layer. A first gate electrode is formed via a first gate insulating film on the region sandwiched by the n-source layer and the n-emitter layer. A second gate electrode is formed via a second gate insulating film on the region sandwiched by the high-concentration p-layer and the p-source layer. On the p-emitter layer, a first main electrode is formed. A second main electrode is formed so as to be in contact with the p-base layer, the n-source layer, and the p-source layer.

7 Claims, 22 Drawing Sheets

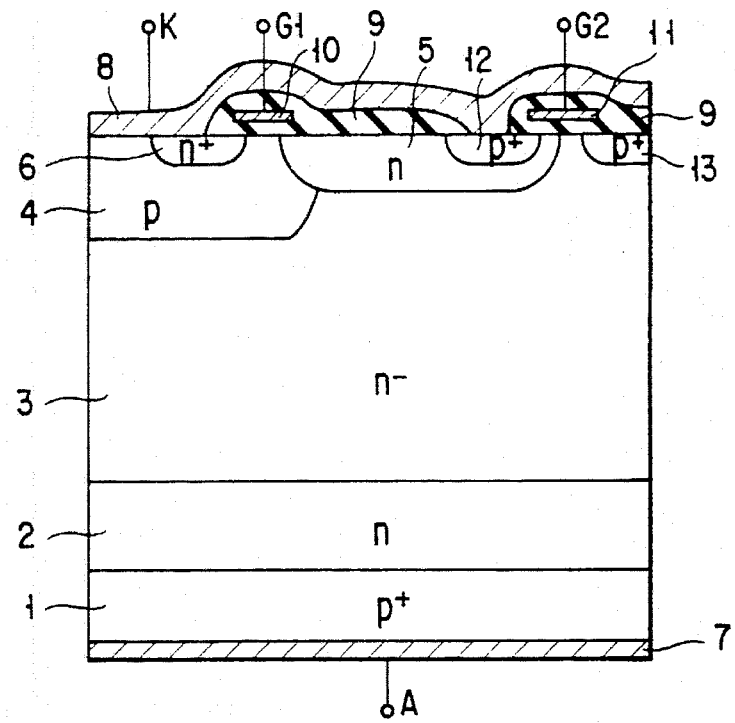
F I G. 1
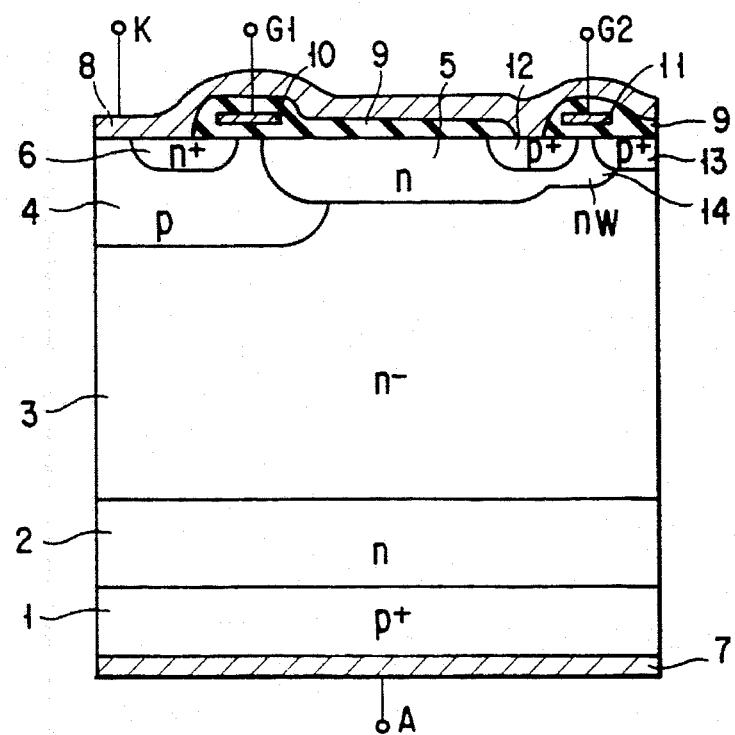
F I G. 2

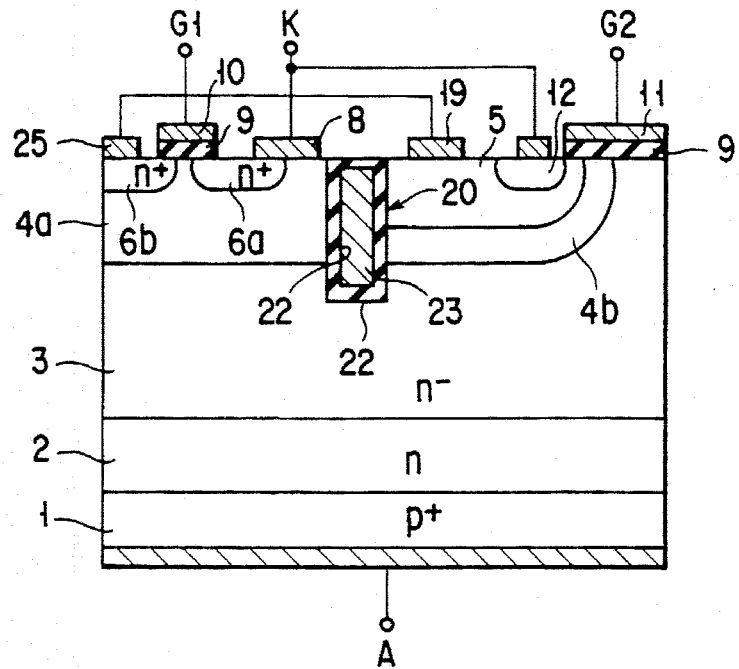
F I G. 5
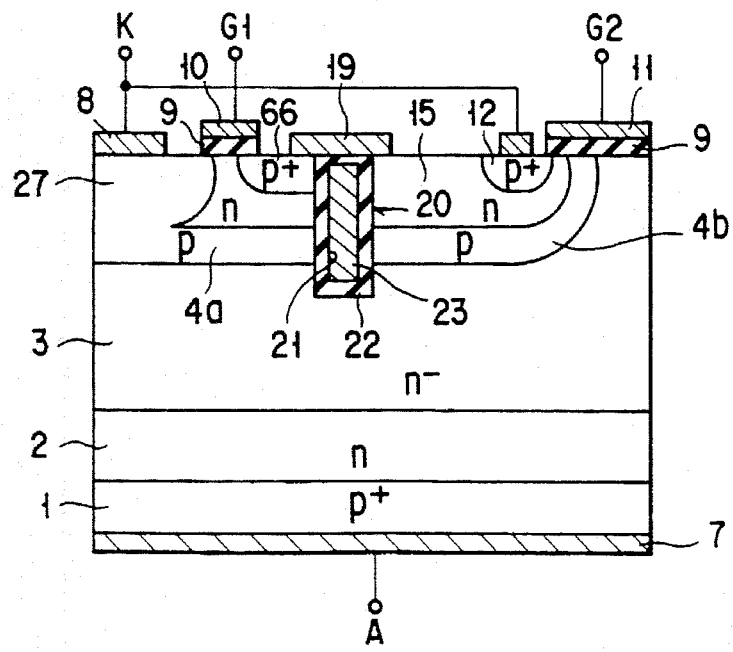
F I G. 6

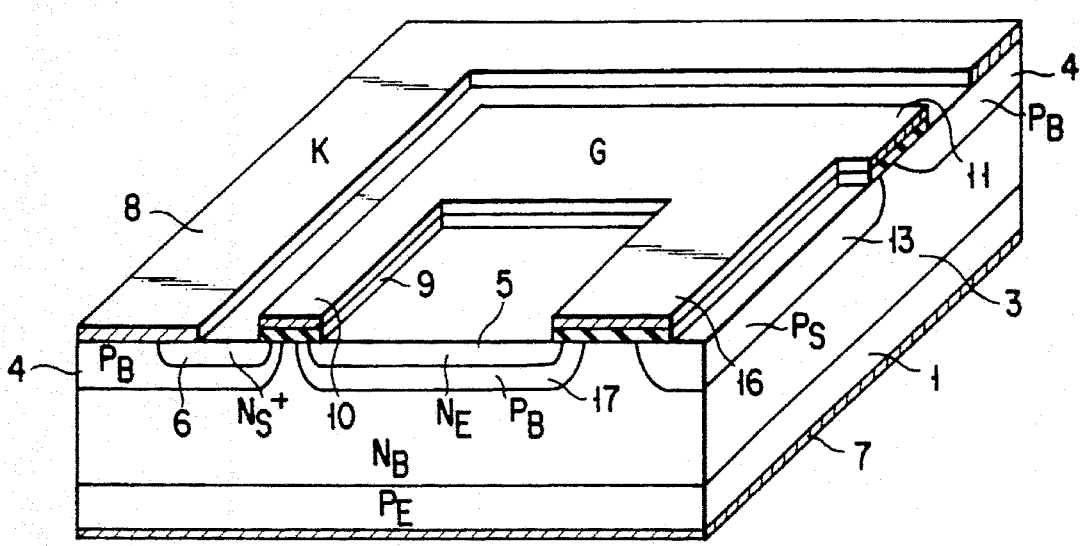
F I G. 10
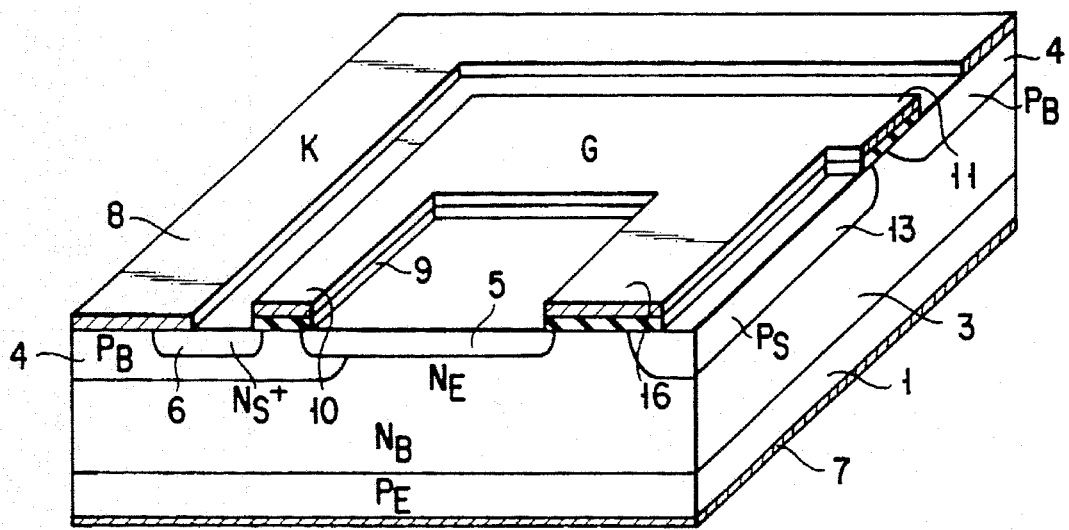
F I G. 11

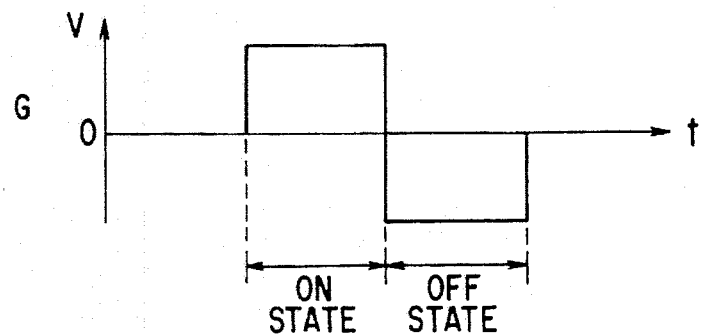
F I G. 12
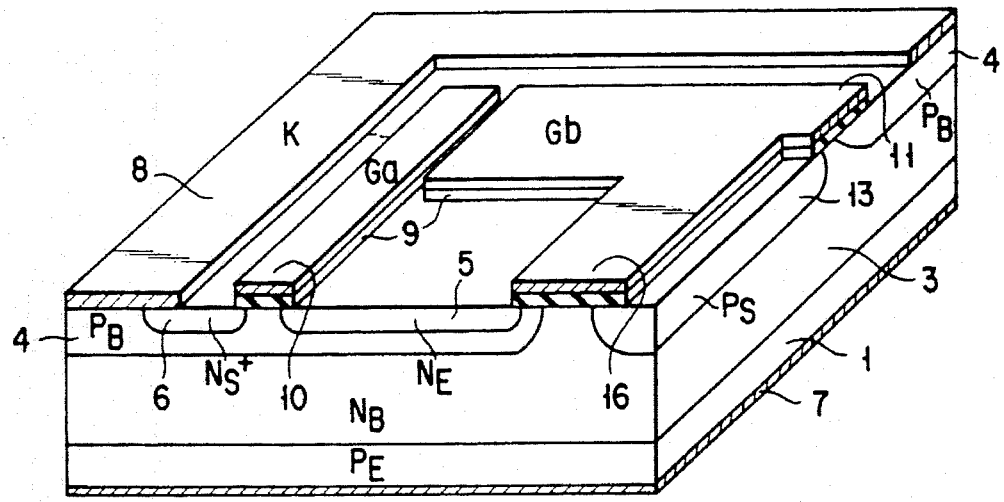
F I G. 13
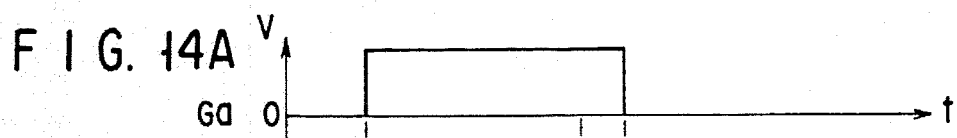
F I G. 14A
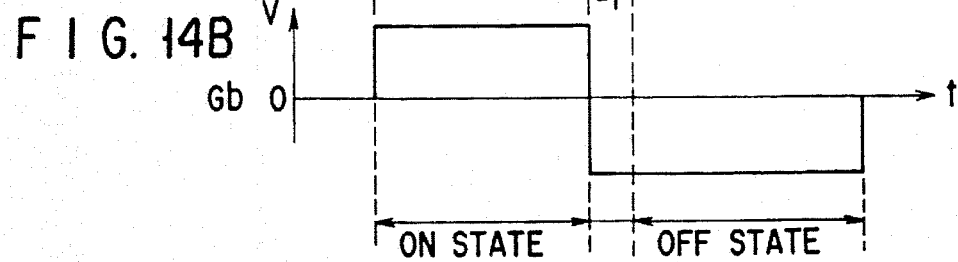
F I G. 14B

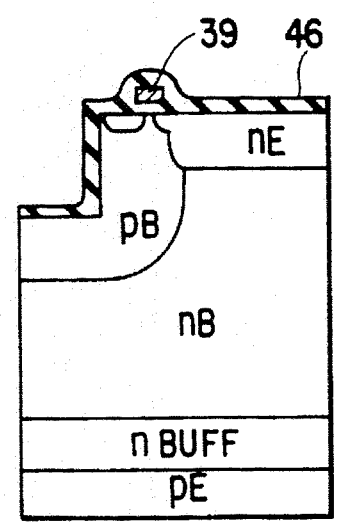
F I G. 22G
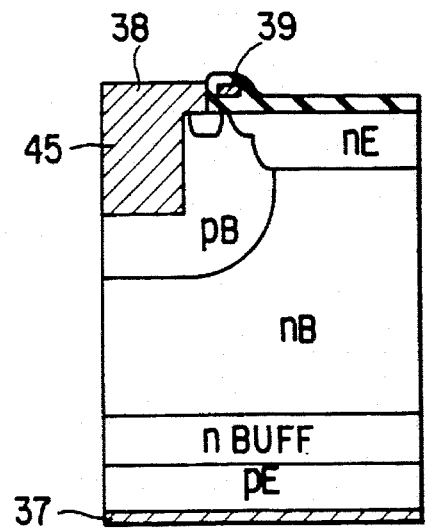
F I G. 22H
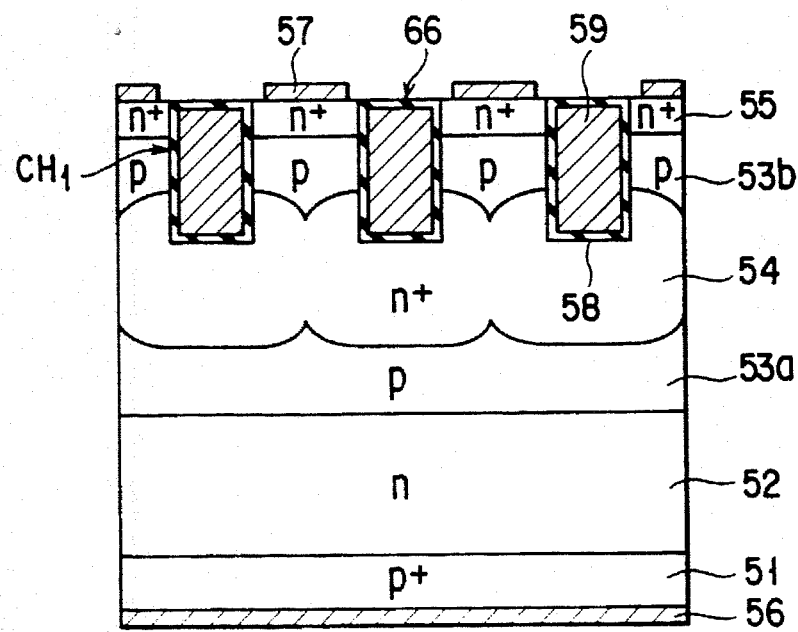
F I G. 23

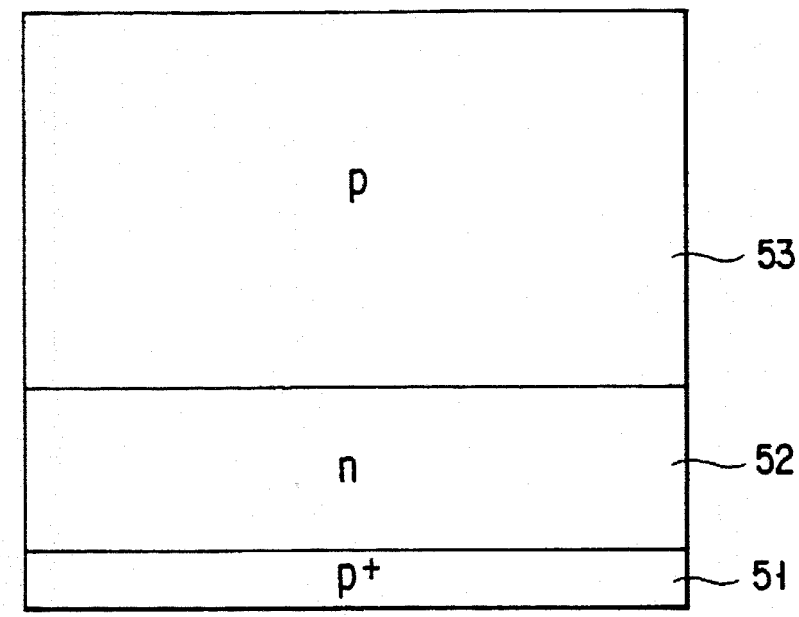
F I G. 24A
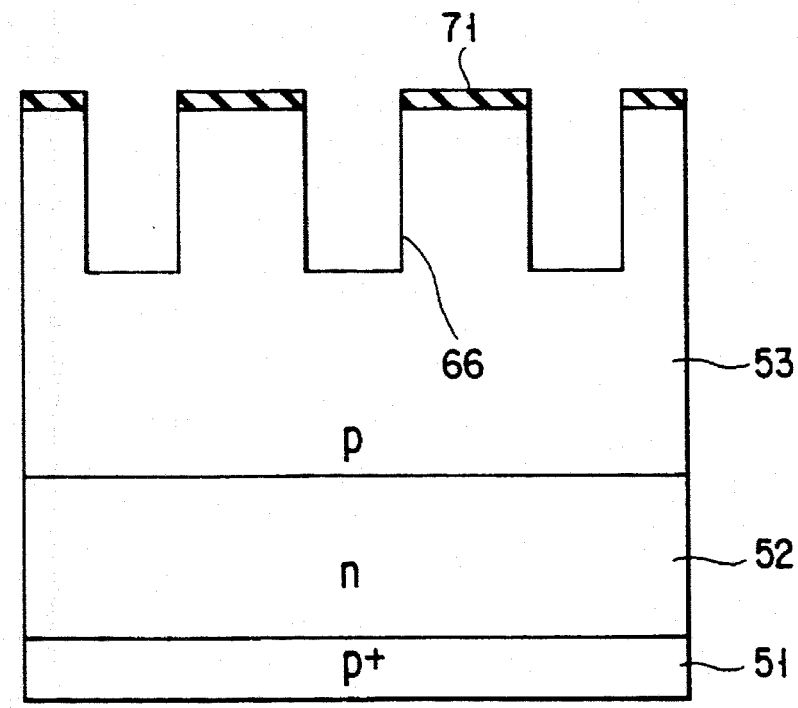
F I G. 24B

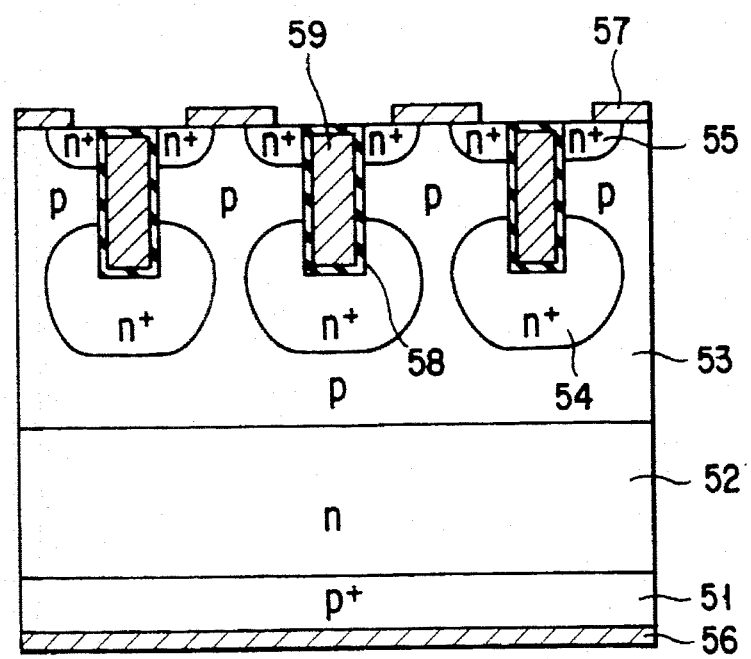
F I G. 26
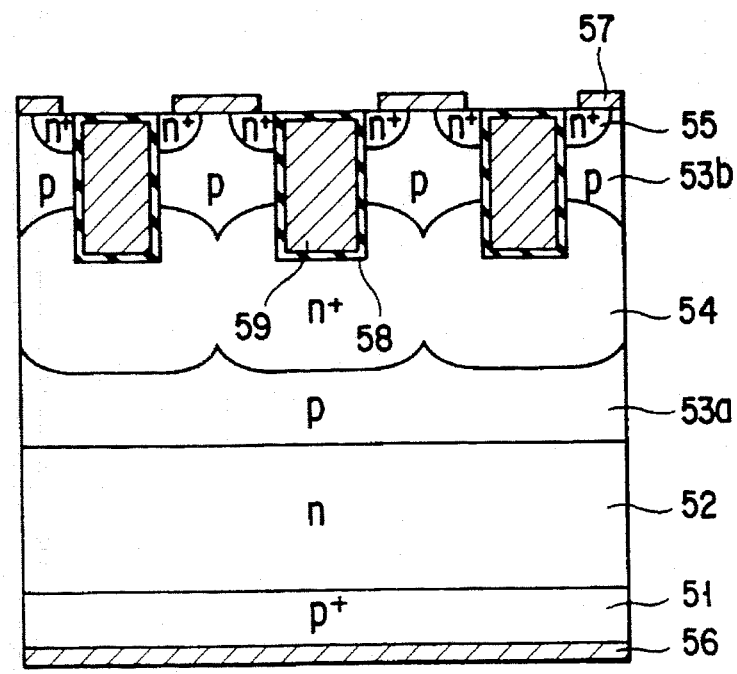
F I G. 27

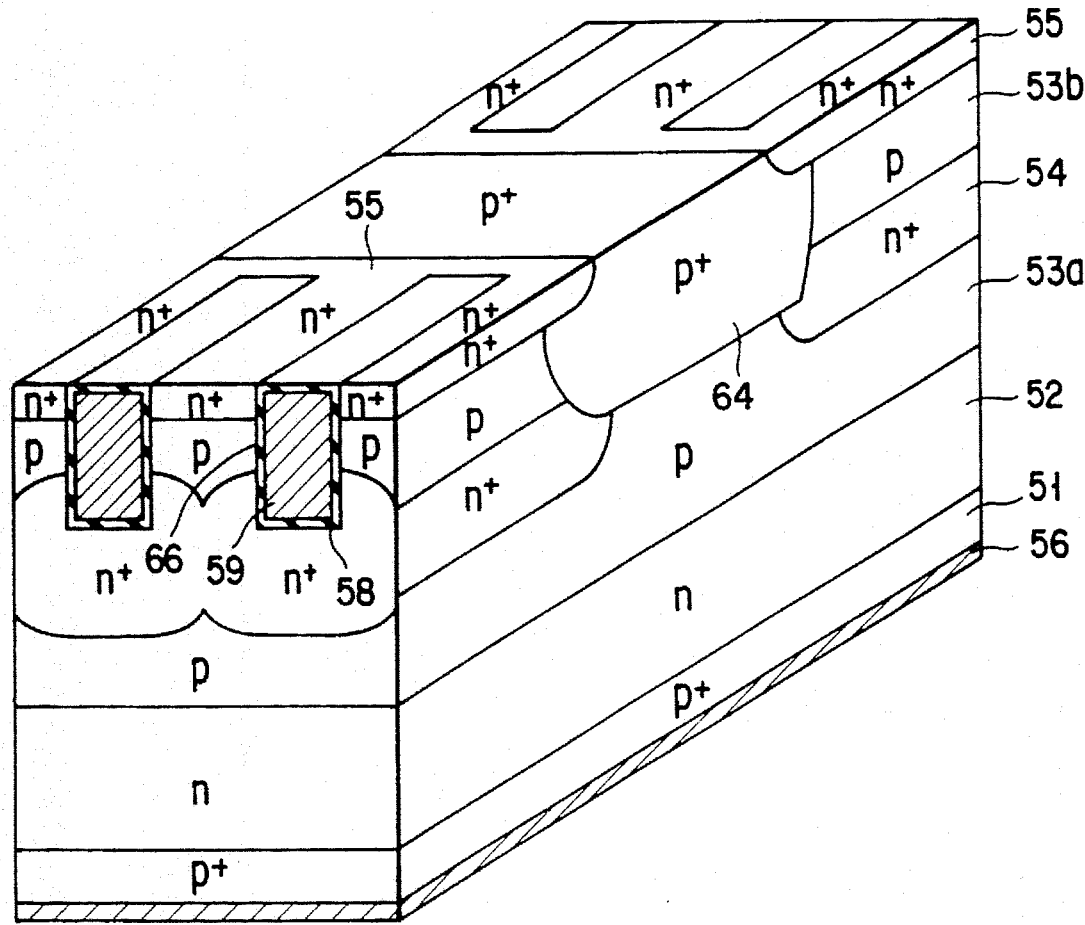
F I G. 28A
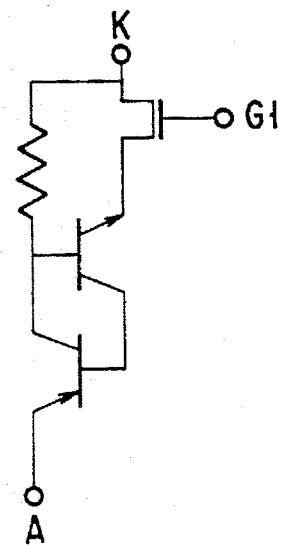
F I G. 28B

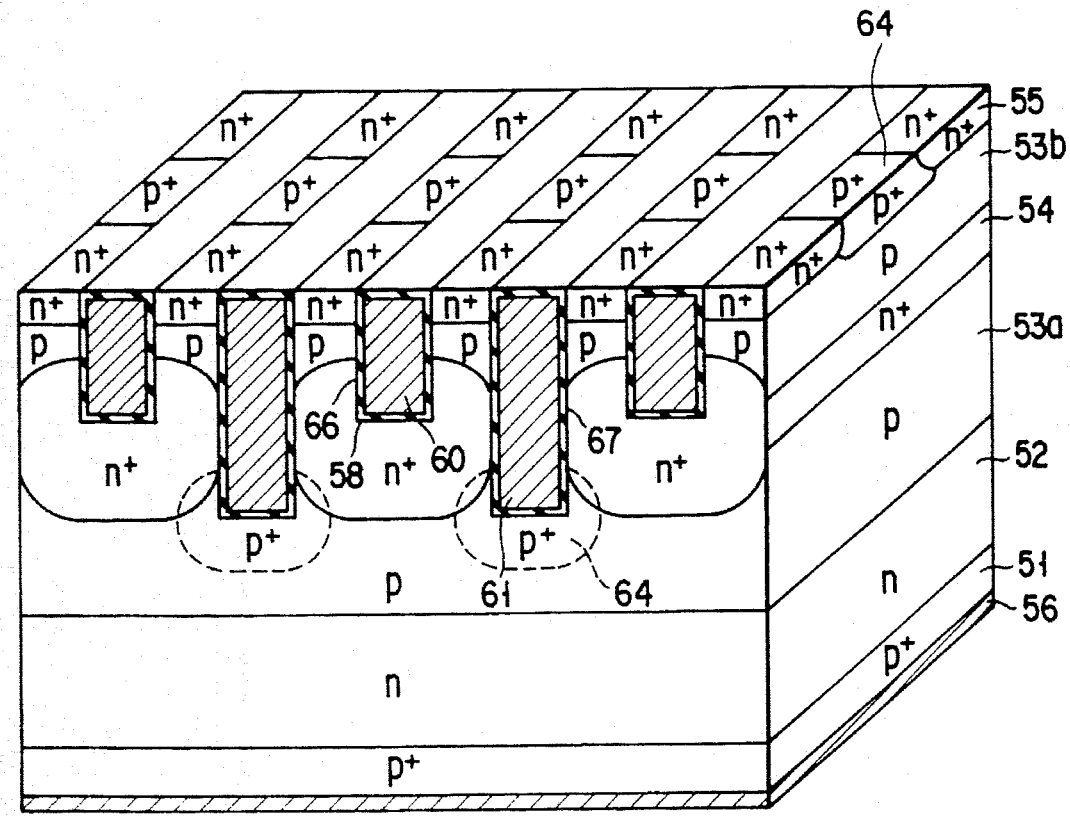
F I G. 29A
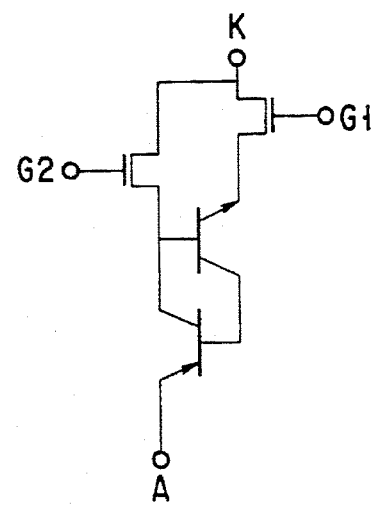
F I G. 29B

POWER SEMICONDUCTOR DEVICE

CROSS-REFERENCES TO THE RELATED APPLICATIONS

This application is a continuation-in-part of U.S. patent application Ser. No. 08/040,595 filed on Mar. 31, 1993, now U.S. Pat. No. 5,298,769.

BACKGROUND OF THE INVENTION

1. Field of the Invention

This invention relates to a power semiconductor device having a MOSFET structure inserted between a cathode emitter and a cathode electrode.

2. Description of the Related Art

A turn-off thyristor shown in FIG. 31 that effects turn-off control by means of an insulated gate has been disclosed in B. J. Baliga, "The MOS-Gated Emitter Switched Thyristor," IEEE ELECTRON DEVICE LETTERS, Vol. 11, pp. 75–77, 1990. In this structure, an n-base layer 52 is formed in contact with a p-emitter layer 51. In the n-base layer 52, a p-base layer 53 and an n-emitter layer 54 are formed by diffusion in sequence, thus forming a pnpn thyristor structure. An anode electrode 56 is in contact with the p-emitter layer 51 by a low resistance. An n-source layer 55 is formed near the n-emitter layer 54. At the surface of the p-base layer 53 sandwiched by these two layers, a gate electrode 59 is formed via a gate insulating film 58. Further, a cathode electrode 57 is in contact with both the n-source layer 55 and a p+-layer 64.

A method of manufacturing the aforesaid device is as follows. First, as shown in FIG. 32A, p-type impurity ions are implanted into the bottom surface of an n-type semiconductor substrate and then diffused to form the p-emitter layer 51. Further, p-type impurity ions are selectively implanted into the top surface of the substrate and then diffused to form the p-base layer 53. Then, as shown in FIG. 32B, p-type impurity ions are selectively implanted into the surface of the p-base layer 53 and then diffused to form the p+-layer 64.

Next, as shown in FIG. 32C, the gate oxide film 58 is formed on the top surface of the wafer that has undergone the above processes. Further on the gate oxide film, a material (e.g., polysilicon) for the gate electrode 59 is deposited. After the deposition, the gate electrode material and the gate oxide film are patterned, and n-type impurity ions are implanted into the resulting opening portions and then diffused to form the n-emitter layer 54 and the n-source layer 55. After that, as shown in FIG. 32D, the interlayer insulating film 63 is deposited and a contact hole 65 is formed. Then, the cathode electrode 57 is connected to the contact hole 65, and the anode electrode 56 is connected to the p-emitter layer 51.

The operation of the above device is as follows. When a positive voltage is applied to the gate electrode 59, electrons pass through the cathode electrode 57, the n-source layer 55, and the n-channel region $CH_1$ and arrive at the n-emitter layer 54. In this state, when a base current is supplied, electrons are injected from the n-emitter layer 54, thereby turning on the thyristor structure consisting of the p-emitter layer 51, the n-base layer 52, the p-base layer 53, and the n-emitter layer 54. Namely, the structure of this device is constructed such that a MOSFET is connected in series with a thyristor structure.

When a negative voltage is applied to the gate electrode 59, the channel region $CH_1$ becomes nonconductive, which stops the supply of electrons to the n-emitter layer 54, causing the thyristor to turn off. At this time, the holes accumulated inside are discharged to the cathode electrode 57 through the p+-layer 64.

Such a conventional insulated-gate turn-off thyristor structure has a disadvantage in that the injection efficiency of electrons from the n-emitter layer 54 into the p-base layer 53 is low, since the p+-layer 64 formed in the p-base layer 53 is in contact with the cathode electrode 57 by a low resistance. In addition, because holes pass through the p-base layer 53 and p+-layer 64 directly under the n-source layer 55 and are discharged to the cathode electrode 57, the p-n junction is forward-biased by a voltage drop caused by the p-layers 53 and 64. This causes a problem in that a parasitic thyristor consisting of the p-emitter layer 51, n-base layer 52, p-base layer 53, and n-source layer 55 latches up, preventing the device from turning off.

To make it difficult for the parasitic thyristor to latch up, it can be considered that the p+-layer 64 is formed so as to completely cover the bottom of the n-source layer 55 with conventional ion implantation and diffusion techniques, however, the p+-layer 64 reaches the channel region $CH_1$. This shifts the impurity concentration of $CH_1$ from its optimum value, making it difficult to control $CH_1$ by the gate voltage. Further, to embed the p+-layer 64 can be considered as a method of preventing the layer 64 from reaching $CH_1$ during its formation. To achieve this, however, epitaxial growth techniques are required, which makes the processing complicated.

As mentioned above, with a conventional EST (emitter switched thyristor), it is difficult to meet the characteristics required for power semiconductor devices in terms of the turn-on and turn-off characteristics.

Additionally, in an insulated-gate turn-off thyristor formed by a conventional manufacturing method, because the p-base layer is short-circuited with the cathode electrode, the electron injection efficiency is low, preventing the production of much finer devices. There is another problem in that, because holes pass through the p-base layer directly under the n-source layer, this permits the parasitic thyristor to latch up, thus preventing the device from turning off. An attempt to overcome this problem requires epitaxial growth techniques in the manufacturing processes, consequently making these processes more complicated.

SUMMARY OF THE INVENTION

Accordingly, an object of the present invention is to provide a power semiconductor device having excellent turn-on and turn-off characteristics.

Another object of the present invention is to provide a manufacturing method capable of forming an insulated-gate turn-off thyristor with a high electron-injection efficiency and a high resistance to the latching-up of a parasitic thyristor, without using epitaxial growth techniques.

According to a first aspect of the present invention, there is provided a power semiconductor device comprising: a first conductivity-type emitter layer; a second conductivity-type base layer formed on the first conductivity-type emitter layer; a first conductivity-type base layer, a second conductivity-type emitter layer, and a high-concentration first conductivity-type layer each formed at the surface of the second conductivity-type base layer; a second conductivity-type source layer formed a specified distance apart from the second conductivity-type emitter in the first conductivity-type base layer; a first conductivity-type source layer formed a specified distance apart from the high-concentration first conductivity-type layer in the second conductivity-type emitter; a first gate electrode formed via a first gate insulating film on the first conductivity-type base layer in the region sandwiched by the second conductivity-type source layer and the second conductivity-type emitter layer; a second gate electrode formed via a second gate insulating film on the region sandwiched by the high-concentration first conductivity-type layer and the first conductivity-type source layer; a first main electrode formed on the first conductivity-type emitter layer; and a second main electrode formed so as to be in contact with each of the first conductivity-type base layer, the second conductivity-type source layer, and the first conductivity-type source layer.

According to a second aspect of the invention, there is provided a power semiconductor device comprising: a first conductivity-type emitter layer; a second conductivity-type base layer formed on the first conductivity-type emitter layer; a first first-conductivity-type base layer and a second first-conductivity-type base layer formed at the surface of the second conductivity-type base layer and separated from each other by a trench structure; a first second-conductivity-type source layer and a second second-conductivity-type source layer formed in the first first-conductivity-type base layer; a first gate electrode formed via a first gate insulating film on the surface of the first first-conductivity-type base layer sandwiched by the first second-conductivity-type source layer and second second-conductivity-type source layer; a cathode electrode formed on the surface of the first second-conductivity-type source layer so as to be in contact with the first conductivity-type base layer; a first source electrode formed on the surface of the second second-conductivity-type source layer; a second conductivity-type emitter layer formed in the second first-conductivity-type base layer; a first conductivity-type source layer formed on the surface the second conductivity-type emitter layer; a second gate electrode formed via a second gate insulating film on the surface of the second conductivity-type emitter layer sandwiched by the second first-conductivity-type base layer and the first conductivity-type source layer; a cathode emitter electrode formed on the surface of the second conductivity-type emitter layer and connected to the first source electrode; a second source electrode formed on the surface of the first conductivity-type source layer and connected to the cathode electrode; and an anode electrode formed on the surface of the first conductivity-type emitter layer.

According to a third aspect of the invention, there is provided a power semiconductor device comprising: a first conductivity-type emitter layer; a second conductivity-type base layer formed on the first conductivity-type emitter layer; a first conductivity-type base layer and a second conductivity-type emitter layer formed at the surface of the second conductivity-type base layer; a second conductivity-type source layer formed a specified distance apart from the second conductivity-type emitter layer in the first conductivity-type base layer; a gate electrode formed via a gate insulating film on the first conductivity-type base layer in the region sandwiched by the second conductivity-type source layer and the second conductivity-type emitter layer; a first main electrode formed on the first conductivity-type emitter layer; and a second main electrode formed so as to be in contact with each of the first conductivity-type base layer and the second conductivity-type source layer; wherein at least one region of the first conductivity-type base layer, the second conductivity-type emitter layer, and the second main electrode has a trench embedded structure.

According to a fourth aspect of the present invention, there is provided a method of manufacturing insulated-gate turn-off thyristors, comprising the steps of: forming a semiconductor substrate having a first conductivity-type emitter layer, a second conductivity-type base layer formed on the first conductivity-type emitter layer, and a first conductivity-type base layer formed by diffusion at the surface of the second conductivity-type base layer; forming a vertical groove by selectively etching the first conductivity-type base layer of the semiconductor substrate; forming a second conductivity-type emitter layer by selectively implanting impurity ions into only the bottom of the vertical groove, followed by annealing and drive-in diffusion; forming an insulating film on the inside face of the vertical groove; forming a gate electrode by filling the vertical groove having the insulating film with a conductive metal material; and selectively forming a second conductivity-type source layer at the surface region of the first conductivity-type base layer; wherein the second conductivity-type emitter layer, the first conductivity-type base layer, and the second conductivity-type source layer constitutes a vertical groove-type field-effect transistor structure.

In the first aspect, the second conductivity-type emitter layer is in direct contact with the second conductivity-type base layer. Because of this, when the device turns on, it is possible to flow a large current from this contact portion. Additionally, in the case of a silicon device, the on voltage is improved by nearly 0.6 V. When the device turns off, closing the first gate and opening the second gate allows a hole current to be drawn by making use of the second gate, thereby reducing the hole current drawn from the first conductivity-type base layer. This not only shortens the turn-off time but also prevents the latching-up of the parasitic thyristor. Furthermore, because a depletion layer expands not only from the first conductivity-type base layer side but also from the high-concentration first conductivity-type layer side, the second conductivity-type emitter layer is quickly brought in a floating state, preventing degradation of the breakdown voltage.

In the second aspect, the first conductivity-type base layer is separated into two by a trench structure. Because of this, when the device turns on, the sheet resistance of the first conductivity-type base layer is very large, which not only allows the device to turn off easily but also suppresses the on voltage at a low level. When the device turns off, opening the second gate allows the carriers accumulated inside to be discharged not only through the cathode electrode in contact with the first conductivity-type base layer but also through the second gate, enabling the device to turn off quickly.

In the third aspect, the second conductivity-type emitter layer is in direct contact with the second conductivity-type base layer. Because of this, when the device turns on, it is possible to flow a large current from the contact portion. Further, in the case of a silicon device, the on voltage is improved by nearly 0.6 V. When the device is turned off, a hole current is bypassed from the first conductivity-type base layer to the second main electrode by closing the gate, which permits the depletion layer extending from the first conductivity-type base layer to expand, causing the device to turn off.

A conventional structure has a disadvantage in that a high voltage is applied to the second conductivity-type emitter layer before the depletion layer extending from the first conductivity-type base layer brings this emitter layer into a floating state, causing a breakdown at the second conductivity-type emitter layer. Because in this device, the second conductivity-type emitter layer is short-circuited with the second conductivity-type base layer, it is possible to make the first conductivity-type base layer deeper than the second conductivity-type emitter layer without decreasing the effective are of the device uselessly, which allows the depletion layer to extend sufficiently during a turn-off action, thereby overcoming the above drawback.

In the fourth aspect, by forming a vertical groove at the surface portion of the first conductivity-type base layer and implanting and diffusing second conductivity-type impurity ions into only the bottom of the vertical groove, the second conductivity-type emitter layer is formed at a specific depth of the first conductivity-type base layer. This makes it possible to form a vertical groove-type field-effect transistor structure without embedding the second conductivity-type emitter layer by epitaxial growth techniques. Further, with the manufacturing method of the fourth aspect, the vertical groove-type field-effect transistor structure is formed through self-alignment, so that the second conductivity-type emitter layer constituting the drain region and the gate electrode basically require no alignment with each other.

Furthermore, since with a device structure formed by the manufacturing method of the fourth aspect, the first conductivity-type base layer just under the second conductivity-type source layer does not serve as a hole-discharging path, the latching-up of a parasitic thyristor is hard to develop. Additionally, because the channel region of the field-effect transistor connected in series with the main thyristor structure is vertically formed just over the second conductivity-type emitter layer, which enables a channel to be formed at a high density and with a greater channel width and makes larger the effective area of the second conductivity-type emitter layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a power semiconductor device according to a first embodiment of the present invention;

FIG. 2 is a sectional view of a modification of the device of FIG. 1;

FIG. 5 is a sectional view of a modification of the device of FIG. 4;

FIG. 6 is a sectional view of another modification of the device of FIG. 4;

FIG. 10 is a perspective view of another modification of the device of FIG. 7;

FIG. 11 is a perspective view of still another modification of the device of FIG. 7;

FIG. 12 is a timing chart for driving the devices of FIGS. 7 to 11;

FIG. 13 is a perspective view of still another modification of the device of FIG. 7;

FIGS. 14A and 14B are timing charts for driving the device of FIG. 13;

FIGS. 22A to 22H are sectional views for explaining a manufacturing process for the device of FIG. 21;

FIG. 23 is a sectional view of the device of an insulated-gate turn-off thyristor according to a fifth embodiment of the present invention;

FIGS. 24A to 24F are sectional views for explaining a manufacturing process for the thyristor of FIG. 23;

FIG. 26 is a sectional view of a modification of the thyristor of FIG. 23;

FIG. 27 is a sectional view of another modification of the thyristor of FIG. 23;

FIGS. 28A and 28B are a sectional view and an equivalent circuit of another modification of the thyristor of FIG. 23, respectively;

FIGS. 29A and 29B are a sectional view and an equivalent circuit of another modification of the thyristor of FIG. 23, respectively;

DETAILED DESCRIPTION OF THE PREFERRED EMBODIMENTS

Figure 3:
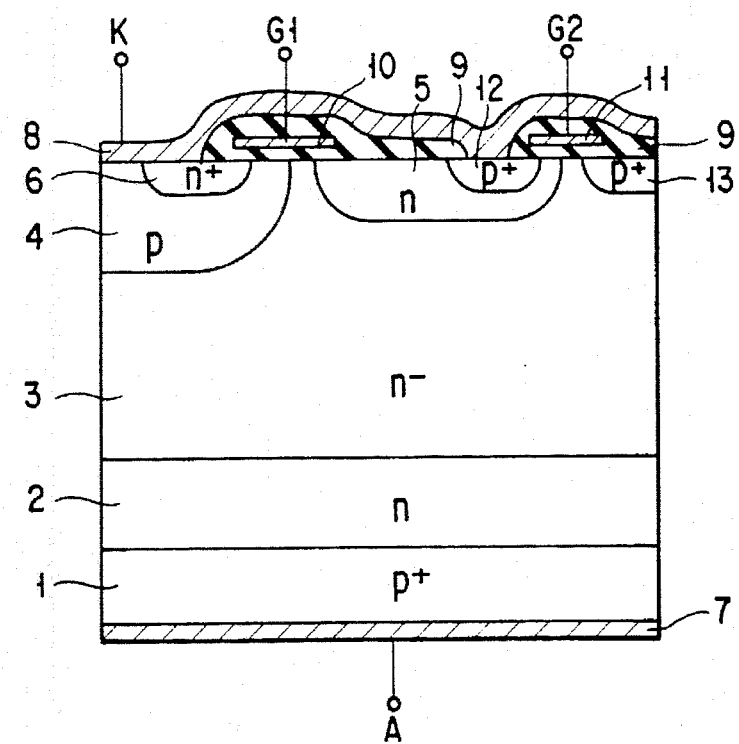
FIG. 3 is a sectional view of another modification of the device of FIG. 1.

Hereinafter, various embodiments of the present invention will be explained, referring to the accompanying drawings. In these embodiments, it is assumed that a first conductivity type is a p-type and a second conductivity type is an n-type. In the explanation below, the common parts in each embodiment are indicated by the same reference symbols.

FIG. 1 is a sectional view of a power semiconductor device according to a first embodiment of the present invention. In this device, a diode structure is composed of a pn structure comprising a p$^+$-emitter layer 1, a high-resistance n$^-$-base layer 3 formed in contact with the p$^+$-emitter layer, and an n-emitter layer 5 formed at the surface of the n$^-$-base layer 3. An n-buffer layer 2 is formed between the p$^+$-emitter layer 1 and the n$^{31}$-base layer 3.

At the surface of the n$^-$-base layer 3, a p-base layer 4 is also formed. In the p-base layer 4, an n$^+$-source layer 6 is formed a specified distance apart from the n-emitter layer 5. Above the p-base layer 4 between the n-emitter layer 5 and the n$^+$-source layer, a first gate electrode 10 is formed via a gate insulating film 9, thereby completing a MOSFET.

Further at the surface of the n$^-$-base layer 3, a high-concentration p$^+$-layer 13 is formed a specified distance apart from the n-emitter layer 5. At the surface of the n-emitter layer 5, a p$^+$-source layer 12 is formed. On the n$^-$-base layer 3 and the n-emitter layer 5 between the p$^+$-source layer 12 and the p$^+$-layer 13, a second gate electrode 11 is formed via a gate insulating film 9, thereby completing a MOSFET.

A cathode electrode 8 is formed so as to be in contact with each of the p-base layer 4, n$^+$-source layer 6, and p$^+$-source layer 12. On the p$^+$-emitter layer 1, an anode electrode 7 is formed.

with a power semiconductor thus constructed, in an off state where a forward voltage is applied between the anode and the cathode, the n-emitter layer 5 and the n$^-$-base layer 3 is in a punched-through state. When in this state, a positive voltage is applied to the first gate electrode 10, the channel of the MOSFET becomes conductive, causing the n-emitter layer 5 to be electrically connected to the cathode electrode 8 through this channel and the n$^+$-source layer 6. This allows electrons to be injected from the n-emitter layer 5 into the n$^-$-base layer 3. When these electrons have reached the p$^+$-emitter layer 1, holes are injected from the p$^+$-emitter layer 1 accordingly, thereby turning on the device.

As mentioned above, in the embodiment of FIG. 1, since the n-emitter layer 5 and the n$^-$-base layer 3 are directly connected to each other without any junction between them, a lot of electrons are injected from the cathode electrode 8 into the n$^-$-base layer 3 during a turn-off time. This enables a quick conductivity modulation, providing an excellent turn-off characteristic. Further, because the number of junctions is fewer than that in an ordinary thyristor structure, the on voltage is lower.

When the voltage applied to the first gate electrode 10 is removed, the MOSFET is turned off, preventing carriers from being injected from the cathode side. Then, the holes among the carries accumulated inside are discharged through the p-base layer 4 to the cathode electrode 8, thus causing the device to turn off. At this time, when a negative voltage is further applied to the second gate electrode 11, the high-concentration p$^+$-layer 13 is connected to the cathode electrode 8 through the channel and the p$^+$-source layer 12. This causes the holes accumulated inside to be discharged not only from the p-base layer 4 but also from this p$^+$-layer 13, thereby shortening the turn-off time. Further, since a depletion layer is also formed from the p$^+$-layer 13 during a turn-off time, the n-emitter layer 5 is placed in a floating state at the beginning of the turn-off action, thus preventing a breakdown.

Since a voltage applied to the first gate electrode and the second gate electrode 11 may be positive during a turn-on time and negative during a turn-off time, the first gate electrode 10 and the second gate electrode 11 may be connected to each other.

FIG. 2 is a sectional view of an embodiment where the device structure of FIG. 1 is modified so that an n-well layer 14 may be formed to form a channel of a second gate. By forming the n-well layer 14 as shown in FIG. 2, the $V_{th}$ of the second gate channel can be set optimally.

FIG. 3 shows another modification of the device structure of FIG. 1. Specifically, the p-base layer 4 is not necessarily in contact with the n-emitter layer 5. For instance, as shown in FIG. 3, they may be separated from each other. As shown in FIG. 2, it is possible to further provide a p-well between the p-base layer 4 and the n-emitter layer 5 to optimize the $V_{th}$ of the first gate channel.

Figure 4:
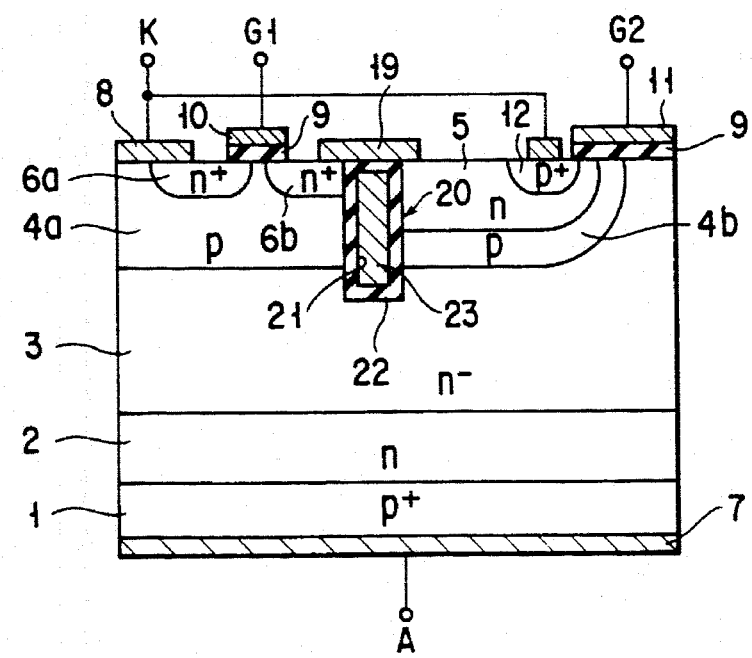
FIG. 4 is a sectional view of a power semiconductor device according to a second embodiment of the present invention.

FIG. 4 is a sectional view of a power semiconductor device according to a second embodiment of the present invention. In this device, a thyristor structure is composed of a pnpn structure consisting of a p$^+$-emitter layer 1, a high-resistance n$^-$-base layer 3 formed in contact with this emitter layer, and a second p-base layer 4b and an n-emitter layer 5 formed at the surface of the n$^-$-base layer 3. An n-buffer layer 2 is provided between the p-emitter layer 1 and the n$^-$-base layer 3. The configuration just mentioned is the same as that of the first embodiment of FIG. 1.

At the surface of the n$^-$-base layer 3, a p-base layer is provided. This p-base layer is separated by a trench structure 20 into a first p-base layer 4a and the second p-base layer 4b. The trench structure 20 is made up of an insulating film 22 formed on the inside face of a trench 21, and a polysilicon layer 23 embedded in the trench 21.

In the first p-base layer 4a, a first n$^+$-source layer 6a and a second n$^+$-source layer 6b are formed a specified distance apart from each other. On the surface of the first p-base layer 4a between the first and the second n$^+$-source layers 6a and 6b, a first electrode 10 is formed via a gate insulating film 9, thereby completing a MOSFET.

In the second p-base layer 4b, an n-emitter 5 is formed next to the trench structure 20. At the surface of this n-emitter layer 5, a p$^+$-source layer 12 is formed. On the surface of the p$^+$-source layer 12, n-emitter layer 5, second p-base layer 4b, and n$^-$-base layer 3, a second gate electrode 11 is formed via the gate insulating film 9, thereby completing a MOSFET.

A cathode electrode 8 is formed so as to be in contact with each of the first p-base layer 4a, first n$^+$-source layer 6a, and p$^+$-source layer 12. On the p$^+$-emitter layer 1, an anode electrode 7 is formed.

To turn on the device of FIG. 4, a positive voltage is applied to the first gate electrode 10 and the second gate electrode 11. This enables electrons to pass through the first n$^+$-source layer 6a, the first gate channel, the second n$^+$-source layer 6b, the cathode emitter electrode 19, the n-emitter layer 5, and the second gate channel, and are injected into the n$^-$-base layer 3. In response to this injection, holes are injected from the p$^+$-emitter layer 1, causing the conductivity modulation.

Figure 31:
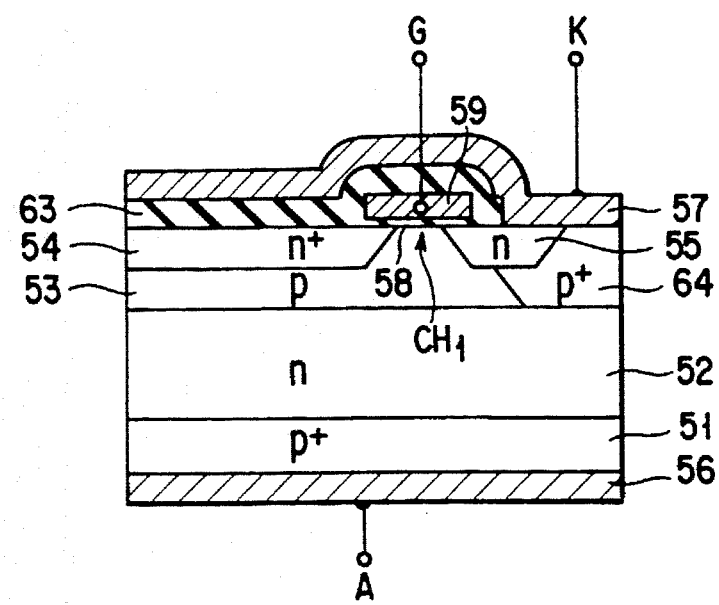
FIG. 31 is a sectional view of a conventional power semiconductor device.
Figure 32A:
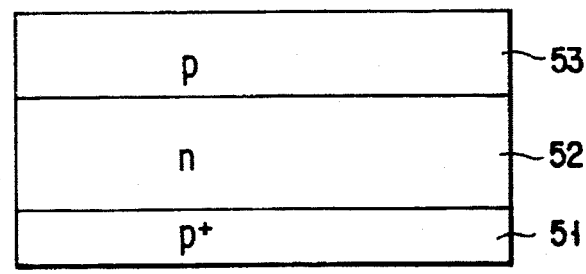
FIGS. 32A to 32D are sectional views for explaining a manufacturing process for the device of FIG. 31.
Figure 32B:
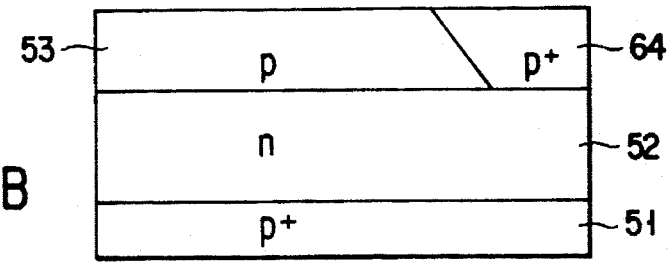
Figure 32C:
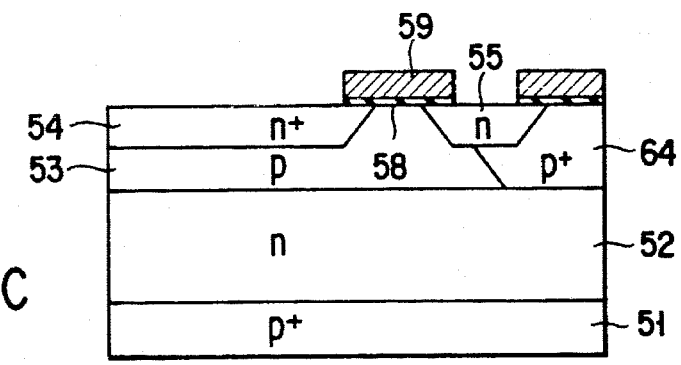
Figure 32D:
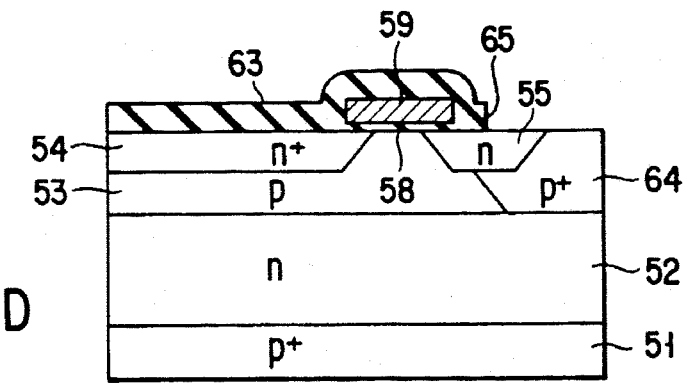

At this time, since in the device structure of FIG. 31, the p-base layer 4 is short-circuited with the cathode electrode 8, part of the injected holes go to the cathode electrode 8 without recombining with electrons, leading to a rise in the on voltage. With the device structure of FIG. 4, however, because the p-base layers 4a and 4b are separated by the trench structure 20, holes cannot go to the cathode electrode easily, and most of them recombine with electrons. As a result, it is possible to prevent the on voltage from rising.

To turn off the device, the applied voltage is removed from or a negative voltage is applied to the first gate electrode 10, and a negative voltage is applied to the second gate electrode 11. This closes the first gate channel, which stops the supply of electrons, causing the second gate to short-circuit the p-base layer 4b with the cathode electrode 8 through the $p^+$-source layer 12. This causes both of the separated first and second p-base layers 4a and 4b to be connected to the cathode electrode, allowing the holes accumulated inside to be discharged quickly.

While with this configuration, the essential object of the trench structure is to separate the p-base layers, the polysilicon layer 23 may be used as a third gate electrode by embedding the polysilicon layer 23 in the trench groove 21 as shown in FIG. 4. In this case, the gate forms a channel around the trench structure 20 during a turn-off time, making it possible to discharge holes more efficiently.

While with this configuration, the turn-on gate is formed at the position of the second gate, it may be formed separately in another position. The device may be triggered optically. By providing a base electrode instead of the insulated gate, the device may be turned on.

Although in the above explanation, all of the insulated gates are of the enhancement type, they may be, of course, of the depression type.

Since the voltages applied to the gates during a turn-on and a turn-off time have the same polarity, the first gate electrode 10 and the second gate electrode 11 may be connected to each other and driven by the same gate signal.

A semiconductor device shown in FIG. 5 is obtained by modifying the semiconductor device of FIG. 4 in a manner that the first $n^+$-source layer 6a and the second $n^+$-source layer 6b are replaced with each other in their position. The basic operation is the same as that of the semiconductor device of FIG. 4. With this configuration, however, holes discharged during a turn-off time are prevented from flowing across under the first $n^+$-source layer 6a and the second $n^+$-source layer 6b. This prevents the parasitic thyristors composed of the first $n^+$-source layer 6a and the second $n^+$-source layer 6b from latching up. In FIG. 5, the first source electrode 25 may be connected to the first p-base layer 4a.

A semiconductor device of FIG. 6 is another modification of the embodiment of FIG. 4, where the first gate is replaced with a p-channel. Turning on is effected by applying a negative voltage to the first gate electrode 10 and a positive voltage to the second gate electrode 11. The holes that have passed through the first gate channel are converted into electrons by the cathode emitter electrode 8 and pass through the second gate channel, and are injected into the $n^-$-base layer 3. In response to this injection, holes are injected from the $p^+$-emitter layer 1, resulting in latching up.

To turn off the device, by closing the first gate and applying a negative voltage to the second gate, the second p-base layer 4b and the cathode electrode 8 are short-circuited to each other through the $p^+$-source layer 12.

With the structure of the semiconductor device of FIG. 6, because the cathode electrode is connected only to the high-concentration $p^+$-layer 27, there is no parasitic thyristor.

Figure 7:
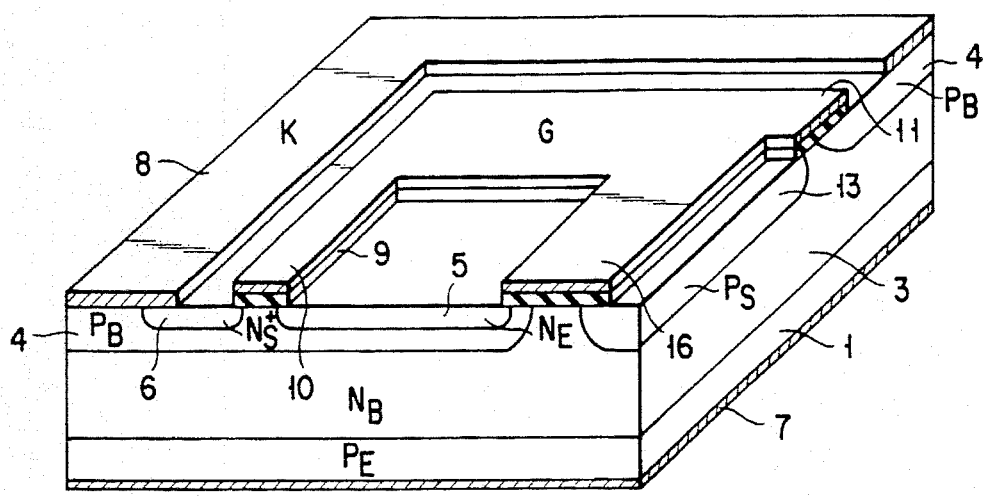
FIG. 7 is a perspective view of a power semiconductor device according to a third embodiment of the present invention.
Figure 8:
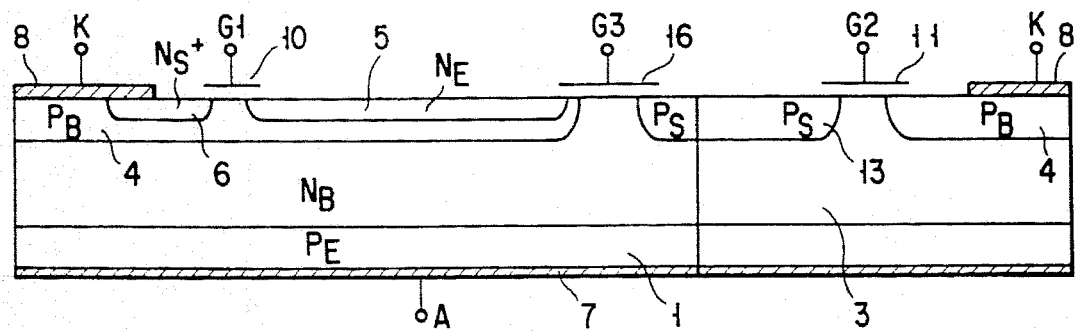
FIG. 8 is a sectional view where first and second sections of FIG. 7 perpendicular to each other are placed side by side on the same plane.

FIG. 7 is a perspective view of a power semiconductor device according to a third embodiment of the present invention. FIG. 8 is a sectional view where first and second sections of the device perpendicular to each other are placed side by side on the same plane. In this device, a p-emitter layer 1, an n-base layer 3 formed in contact with this emitter layer, a p-base layer formed at the surface of the n-base layer 3, and an n-emitter layer 5 constitute a pnpn structure of a thyristor.

In the p-base layer 4, an n-source layer 6 is formed a specified distance apart from the n-emitter layer 5. Above the surface of the p-base layer 4 between the n-emitter layer 5 and the n-source layer 6, a first gate electrode 10 is formed via a gate insulating film 9, thereby completing a first MOSFET G1 shown in the first section.

At the surface of the n-base layer 3, a high-concentration p-source layer 13 is formed so as to be enclosed by the p-base layer 4 with a specific distance between them. As shown in the second section, on the n-base layer 3 between the p-source layer 13 and the p-base layer 4, a second gate electrode 11 is formed via the gate insulating film 9, thereby completing a second MOSFET G2.

Furthermore, as shown in the first section, on the n-emitter layer 5, p-base layer 4, n-base layer 3, and p-source layer 13, a third gate electrode 16 is formed via the gate insulating film 9, thereby completing a third MOSFET G3. The first to third gate electrodes 10, 11, and 16 are formed integrally as an electrode plate G as shown in FIG. 7.

A cathode electrode 8 is formed so as to be in contact with each of the p-base layer 4 and the n-source layer 6. The cathode electrode 8 is arranged so as to enclose the gate electrode plate G. An anode electrode 7 is formed on the $p^+$-emitter layer 1.

To turn on a power semiconductor device thus constructed, a positive voltage is applied to the gate electrode plate G with a forward voltage applied between the anode and the cathode, as shown in FIG. 12. This makes the channels of MOSFETs G1 and G3 conductive, causing the n-base layer 3 to be electrically connected to the cathode electrode 8 through the n-source layer 6 and the n-emitter layer 5. When electrons are injected from the n-emitter layer 5 into the n-base layer 3 and these electrons reach the p-emitter layer 1, holes, in response to this injection, starts to be injected from the p-emitter layer, thereby turning on the device.

To turn off this semiconductor device, a negative voltage is applied to the gate electrode plate G as shown in FIG. 12. This electrically disconnects the n-base layer 3 from the n-source layer 6, and electrically connects the p-source layer 13 to the p-base layer 4 through the channels of MOSFETs G2 and G3. Consequently, the injection of electrons from the cathode side is stopped, and holes are discharged to the cathode electrode 8 through the p-source layer 13 and the p-base layer 4, thereby turning off the device.

Figure 9:
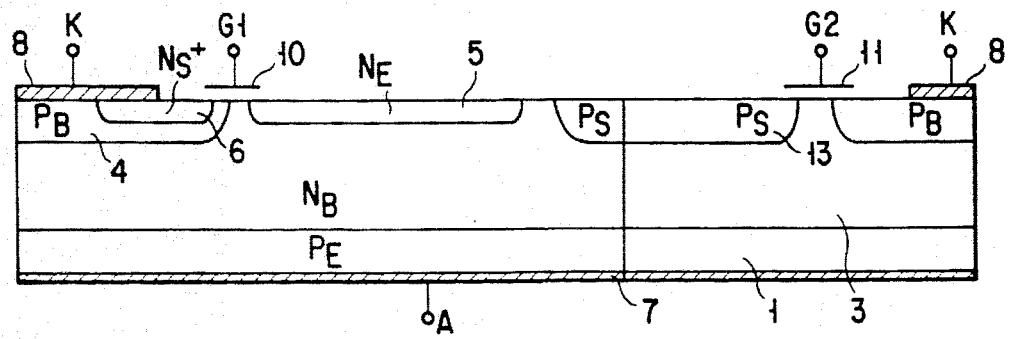
FIG. 9 is a sectional view of a modification of the device of FIG. 7.

A semiconductor device of FIG. 9 is a modification of the embodiment of FIG. 7. In this device, the n-emitter 5 is directly connected to the n-base layer 3 without the intervention of the p-base layer 4. With this device, a lot of electrons are injected from the cathode electrode 8 into the n-base layer 3 during a turn-on time as explained in the embodiments in FIGS. 1 to 3. This enables a quick conductivity modulation, providing an excellent turn-on characteristic. Further, because the number of junctions is fewer than that in an ordinary thyristor structure, the on voltage is lower.

A semiconductor device of FIG. 10 is another modification of the embodiment of FIG. 7. In this device, the n-emitter layer 5 is separated from the p-base layer 4 by the floating first p-base layer 17. This arrangement also improves the on voltage.

A semiconductor of FIG. 11 is a modification of the device of FIG. 9, where the p-base layer 4 is formed so as to cover part of the n-emitter layer 5. In this case, the threshold voltage of the first MOSFET G1 (including the gate electrode 10) that connects the n-source layer 6 to the n-emitter layer 5 can be stabilized.

The devices of FIGS. 7 to 11 can be driven with the timing shown in FIG. 12, as described in FIG. 7. Specifically, to turn on the device, a positive voltage is applied to the gate electrode plate G, whereas to turn off the device, a negative voltage is applied to the gate electrode plate G.

A semiconductor device of FIG. 13 is another modification of the embodiment of FIG. 7. In this device, the gate electrodes 11 and 16 are formed integrally as an electrode plate Gb, whereas the gate electrode 10 is formed as an electrode Ga separated from the electrode Gb. The device of FIG. 13 can be driven with the timing shown in FIGS. 14A and 14B. Specifically, when the device is switched from the turn-on state to the turn-off state, a delay time of dt can be set, which makes it possible to reduce a loss caused during a turn-off time.

Figure 15:
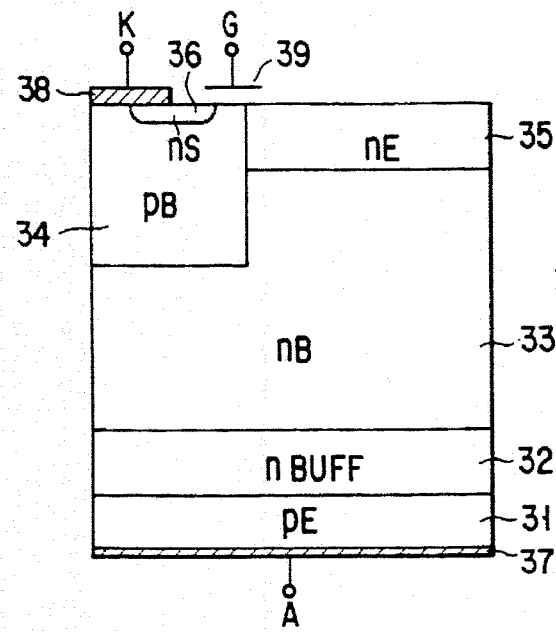
FIG. 15 is a sectional view of a power semiconductor device according to a fourth embodiment of the present invention.

FIG. 15 is a sectional view of a power semiconductor device according to a fourth embodiment of the present invention. In this device, a diode structure is composed of a pn structure comprising a $p^+$-emitter layer 31, a high-resistance $n^-$-base layer 33 formed in contact with the $p^+$-emitter layer, and an n-emitter layer 35 formed by diffusion or epitaxial growth at the surface of the $n^-$-base layer 33. An n-buffer layer 32 is formed between the p-emitter layer 31 and the $n^-$-base layer 33. The arrangement just explained is the same as that of the first embodiment of FIG. 1.

On the $n^-$-base layer 33, the p-base layer 34 is formed next to the n-emitter layer 35. The p-base layer 34 is formed by forming a trench and embedding a p-semiconductor layer there. Because with a method of forming the base layer by ordinary diffusion, p-type impurities diffuse laterally, an attempt to form a deeper p-base layer allows impurities to diffuse laterally as well, thus reducing the effective area of the n-emitter layer 35. The embedding method as in this embodiment, however, only allows a small amount of lateral diffusion due to annealing, making it possible to easily form a p-base layer with a high aspect ratio (d/l≧1 where d is a depth and l is a width).

In FIG. 15, reference numeral 36 indicates an $n^+$-source layer, 37 an anode layer, 38 a cathode electrode, and 39 a gate electrode.

Figure 16:
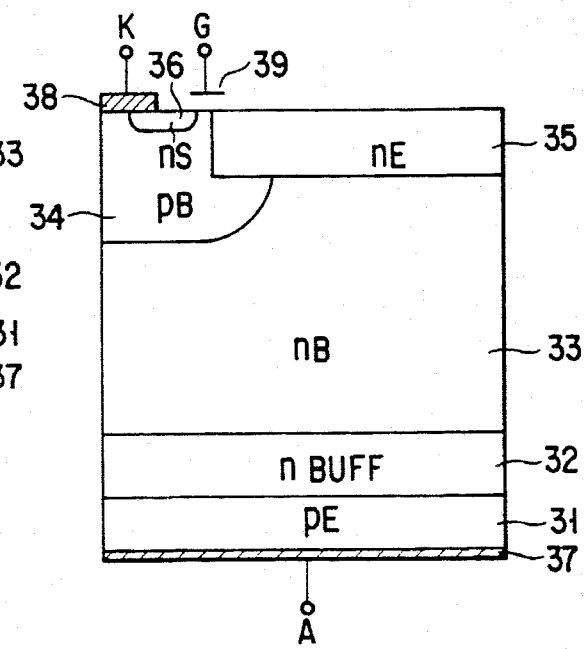
FIG. 16 is a sectional view of a modification of the device of FIG. 15.

FIG. 16 shows a modification of the embodiment of FIG. 15, where an n-emitter layer 35 is formed by embedding. As with the embodiment of FIG. 15, because there is no lateral diffusion, a dose of impurities in the n-emitter layer 35 can be made greater than the process of forming the n-emitter layer 35 by ordinary diffusion, which makes it possible to lower the resistance of the device, thereby lowering the on voltage.

Figure 17:
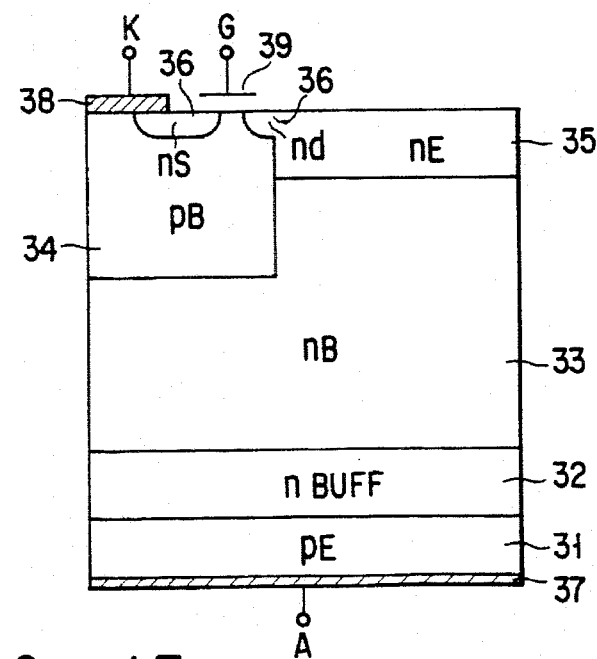
FIG. 17 is a sectional view of another modification of the device of FIG. 15.

FIG. 17 shows another modification of the embodiment of FIG. 15. The basic structure is the same as that of FIG. 15, where the MOS channel is formed by self-alignment.

FIGS. 18A to 18F are sectional views for explaining a manufacturing process for the semiconductor device of FIG. 17.

Figure 18A:
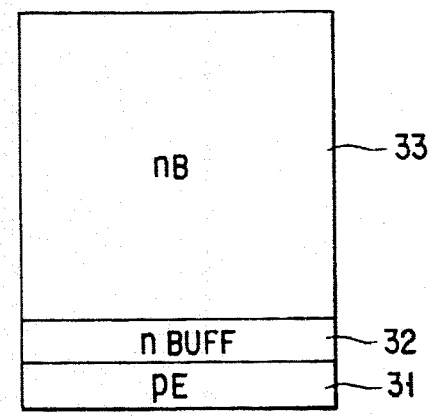
FIGS. 18A to 18F are sectional views for explaining a manufacturing process for the device of FIG. 17.
Figure 18B:
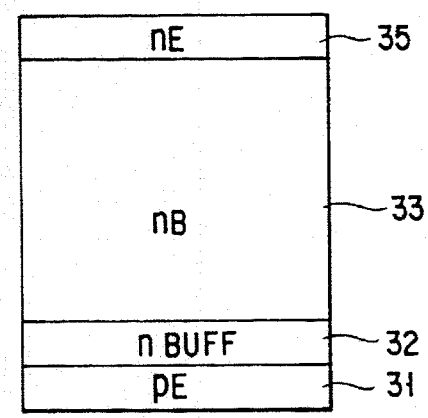
Figure 18C:
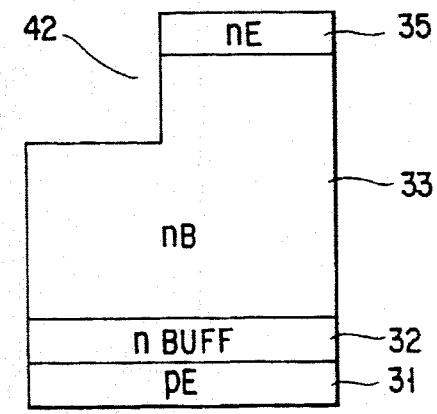
Figure 18D:
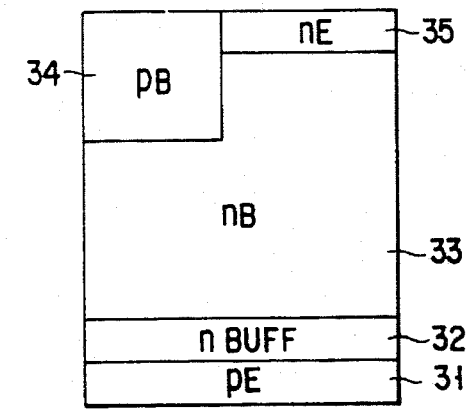
Figure 18E:
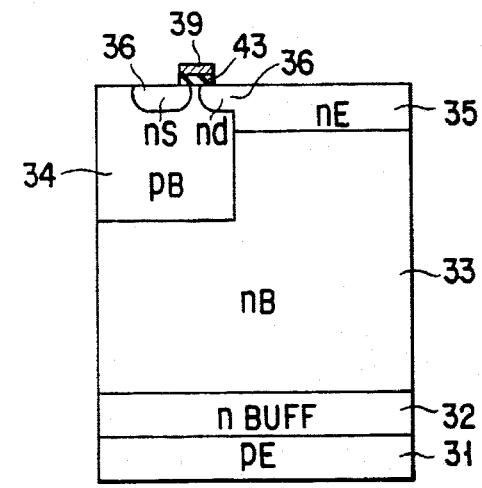
Figure 18F:
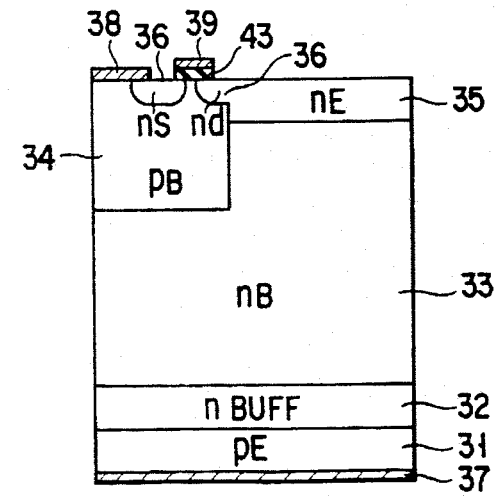

As shown in FIG. 18A, on the bottom surface of a substrate to serve as the n-base layer 33, the n-buffer layer 32 and the p-emitter layer 31 are formed. As shown in FIG. 18B, on its top surface, the n-emitter layer 35 is formed by diffusion or epitaxial growth techniques. Next, as shown in FIG. 18C, a groove 42 is formed in a specified position of the top surface. Further, as shown in FIG. 18D, a layer containing p-type impurities is filled in the groove to form the p-base layer. Then, as shown in FIG. 18E, the MOS gate is formed by self-alignment techniques. Finally, as shown in FIG. 18F, a specific electrode is provided.

As explained above, with the present embodiment, by combining a diode structure with a MOSFET structure suitably, a power semiconductor device with both an excellent turn-on and an excellent turn-off characteristic can be obtained.

Figure 19:
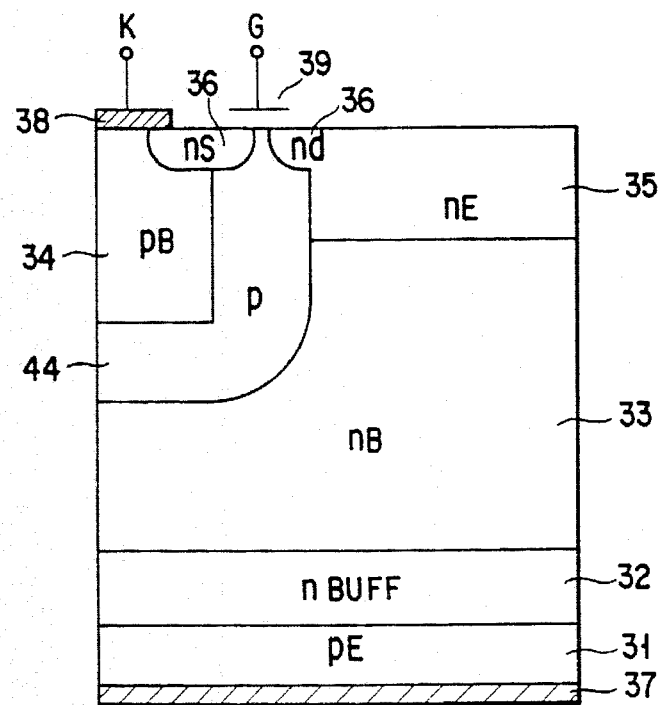
FIG. 19 is a sectional view of another modification of the device of FIG. 15.

FIG. 19 is a sectional view of a modification of the fourth embodiment of the present invention. In this modification, a p-layer 44 is formed by diffusion before embedding. Then, a p-base layer 34 is formed by embedding. By doing this, the main junction can be formed more excellently than by simply embedding a high-concentration p-base layer. By forming an insulated gate on the p-diffusion layer 44, a stable channel can be formed. Further, the reduction of the effective area due to the addition of the p-diffusion layer 44 can be suppressed sufficiently by raising the aspect ratio of the trench.

While in the case of the example of FIG. 19, the p-layer 44 is formed by diffusion before embedding, using the embedded high-concentration p-base layer 34 as a diffusion source also enables the p-diffusion layer 44 to be formed similarly.

Figure 20A:
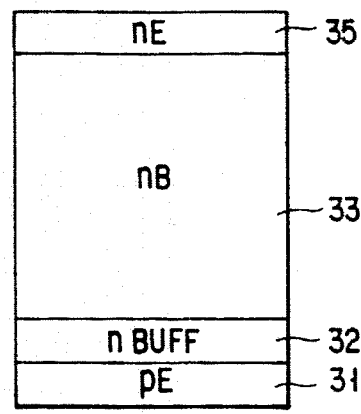
FIGS. 20A to 20F are sectional views for explaining a manufacturing process for the device of FIG. 19.
Figure 20B:
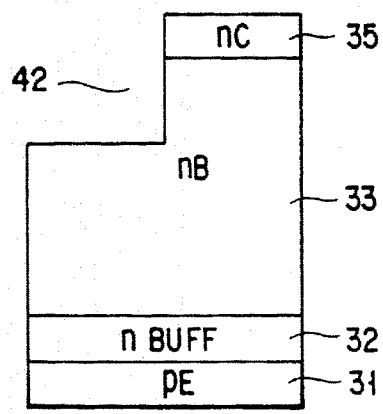
Figure 20C:
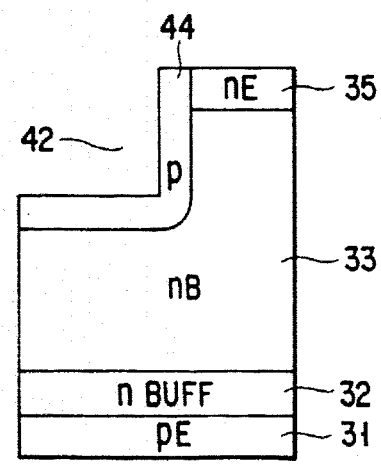

FIGS. 20A to 20F are sectional views for explaining a manufacturing process for the semiconductor device of FIG. 19. First, as shown in FIG. 20A, on the bottom surface of a substrate to serve as the n-base layer 33, the n-buffer layer 32 and the p-emitter layer 31 are formed, whereas on its top surface, the n-emitter layer 35 is formed by diffusion or epitaxial growth techniques. Next, as shown in FIG. 20B, a trench groove 42 is formed in a specified position of the top surface. Further, as shown in FIG. 20C, the p-diffusion layer 44 is formed at the side-walls and the bottom of the trench groove 42.

Figure 20D:
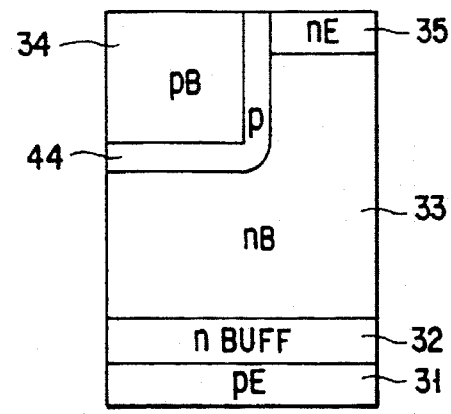
Figure 20E:
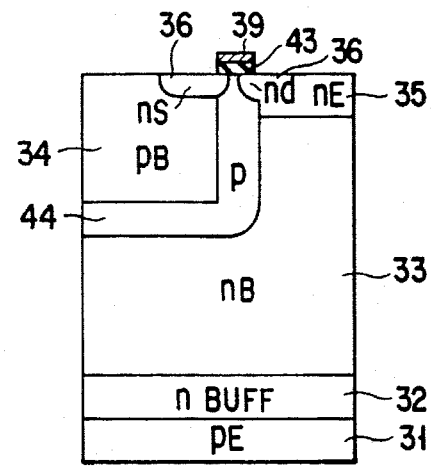
Figure 20F:
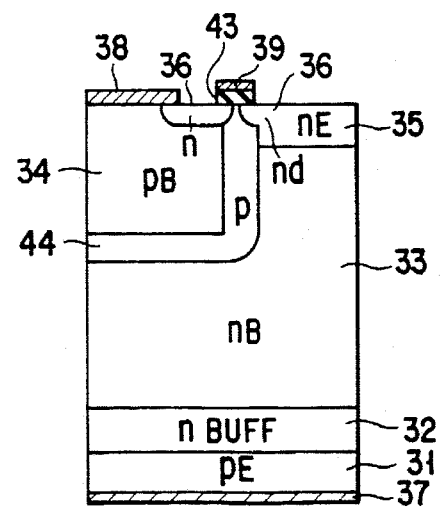

After this, as shown in FIG. 20D, the embedded layer 34 containing high-concentration impurities is formed in the trench groove 42. Then, as shown in FIG. 20E, a channel is formed by self-alignment techniques. Finally, as shown in FIG. 20F, an electrode is formed in a specified position.

Figure 21:
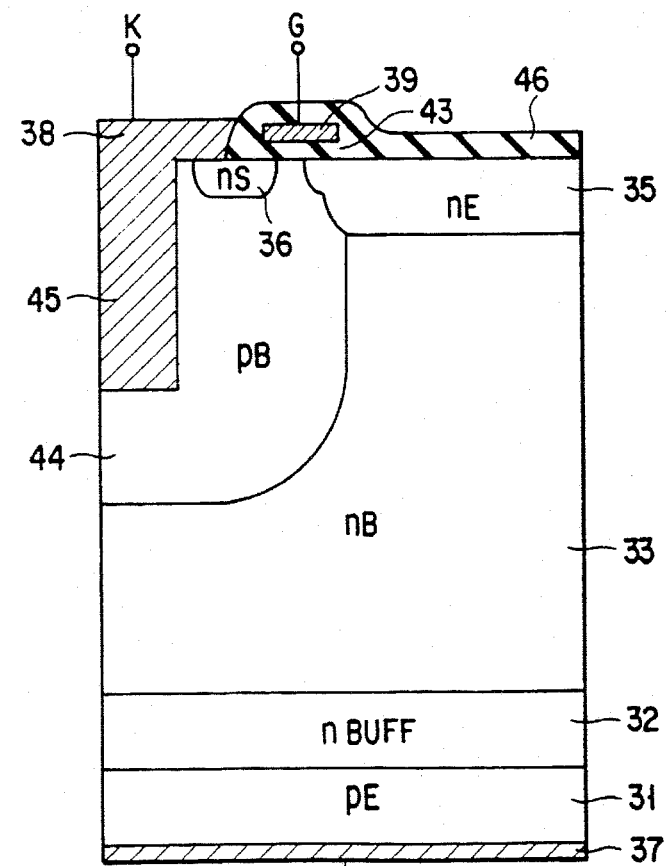
FIG. 21 is a sectional view of a modification of the device of FIG. 19.

FIG. 21 is a sectional view of a modification of the semiconductor device of FIG. 19. In this modification, the p-base layer 34 in the semiconductor device of FIG. 19 is replaced with a metal electrode 45. Even with this configuration, there is no problem with the breakdown voltage as long as the dose in the p-layer 44 formed by diffusion is sufficient. Because this configuration increases the effective area of the electrode, enabling a large current to flow even in a finer structure.

FIGS. 22A to 22H are sectional views for explaining a manufacturing process for the semiconductor device of FIG. 21. Normally, to form a diffusion layer in a specified position of the device, patterning is effected using a resist. In the case of semiconductor devices with trench structures shown in FIGS. 15 to 21, the trench structure portion forms a step. At this step portion, a resist can break, preventing the resist from protecting the underlying layer. To overcome this problem, in the manufacturing process shown in FIGS. 22A to 22H, the trench is filled with polysilicon once, and the diffusion layer is formed in a state where the surface of the device is flattened.

Figure 22A:
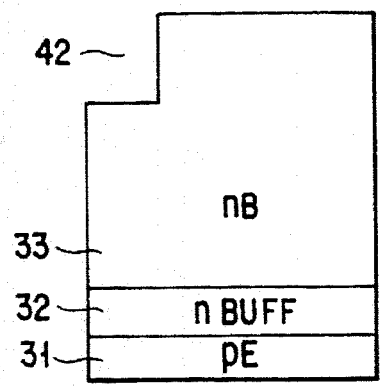

Specifically, first as shown in FIG. 22A, on the bottom surface of a substrate to serve as the n-base layer 33, the n-buffer layer 32 and the p-emitter layer 31 are formed. Then, a trench groove 42 is formed in a specified position of the surface. Then, as shown FIG. 22B, the diffused p-base layer 44 is formed at the sidewalls and the bottom of the trench groove 42 and the entire surface are protected by an oxide film 46. Next, as shown in FIG. 22C, the trench groove 42 is filled with polysilicon 47 to flatten the surface of the device.

Figure 22D:
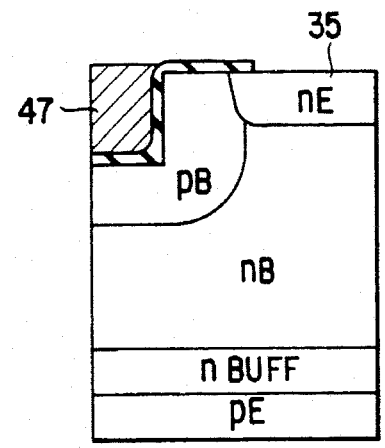
Figure 22B:
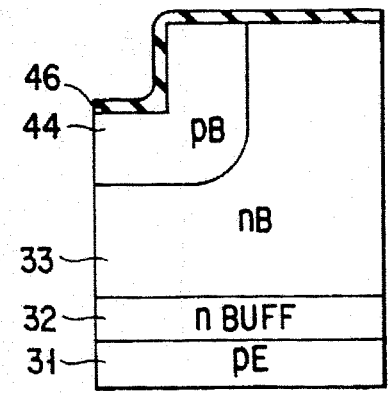
Figure 22E:
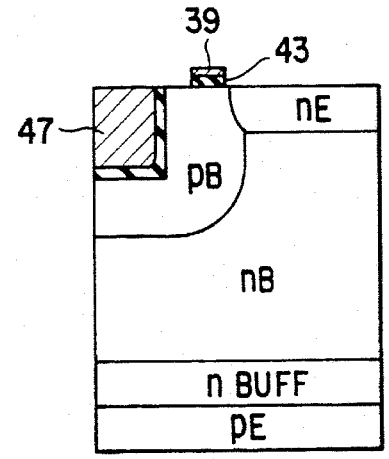
Figure 22C:
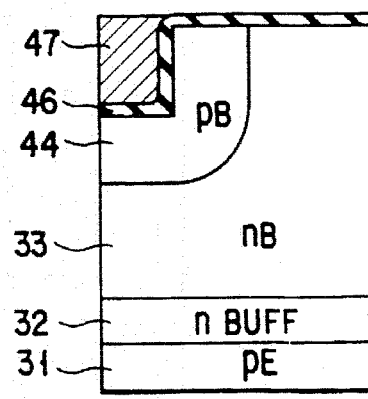
Figure 22F:
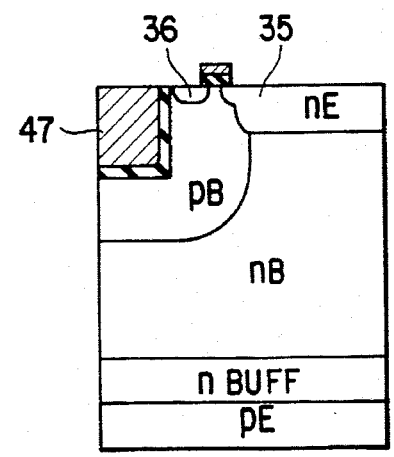

After that, as shown in FIG. 22D, the surface is patterned to remove part of the oxide film 46 to form the n-emitter layer 35. Then, as shown in FIG. 22E, the gate electrode 39 is formed via the gate oxide film 43. Further, as shown in FIG. 22F, after the n-source/drain layer 36 is formed, the entire surface of the device is protected by an oxide film as shown in FIG. 22G, and the polysilicon filled in the trench and the oxide film are removed. Finally, as shown in FIG. 22H, specific electrodes including the embedded electrode 45 are formed.

FIG. 23 is a sectional view of a device of an insulated-gate turn-off thyristor according to a fifth embodiment of the present invention. As shown in FIG. 23, an n-base layer 52 is formed in contact with a p-emitter layer 51. In the n-base layer 52, a p-base layer 53 and an n-emitter layer 54 are formed by diffusion, thus forming a pnpn thyristor structure. The p-base layer 53 is separated by the n-emitter layer 54 into the upper and the lower layers 53a and 53b.

At the surface of the p-base layer 53, a vertical groove portion 66 is selectively formed. In the vertical groove 66, a first gate electrode 59 is formed via a gate insulating film 58. Above the n-emitter layer 54, an n-source layer 55 is formed. In a portion where the p-base layer 53b sandwiched by the n-emitter layer 54 and the n-source layer 55 is in contact with the vertical groove portion 66, an n-channel MOSFET with channel region $CH_1$ is formed.

Figure 24C:
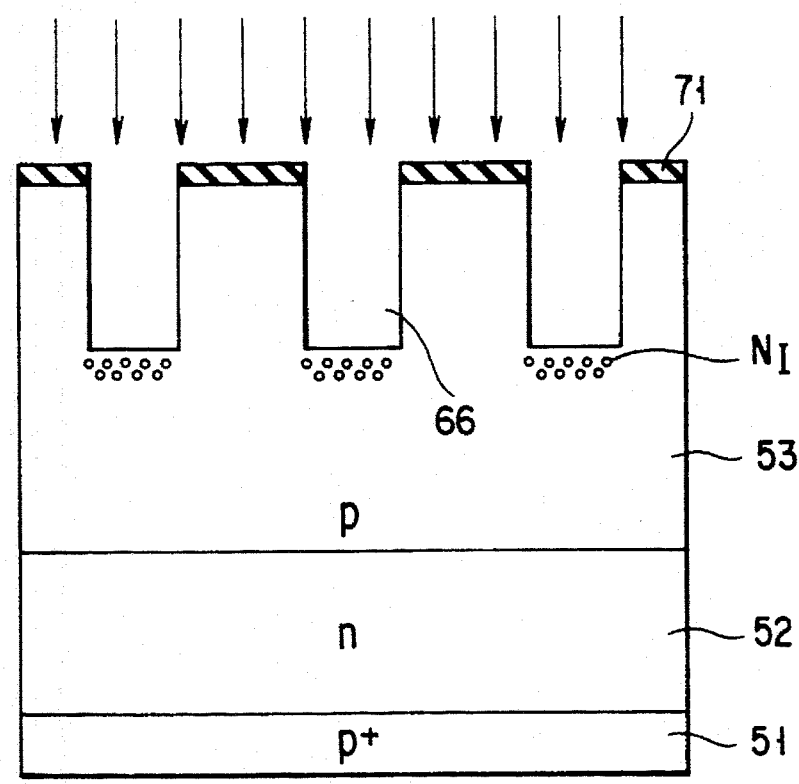

A method of manufacturing thyristors having the above configuration will be explained, referring to FIGS. 24A to 24F. First, as shown in FIG. 24A, p-type impurity ions are implanted into the bottom surface of an n-type semiconductor substrate and then diffused to form a p-emitter layer 51. Further, p-type impurity ions are implanted into the top surface of the substrate and then diffused to form a p-base layer 53. Then, as shown in FIG. 24B, using a mask layer 71 such as an oxide film pattern, a vertical groove portion (trench) 66 is selectively formed at the surface of the p-base layer 53 by dry etching techniques such as RIE.

Figure 24D:
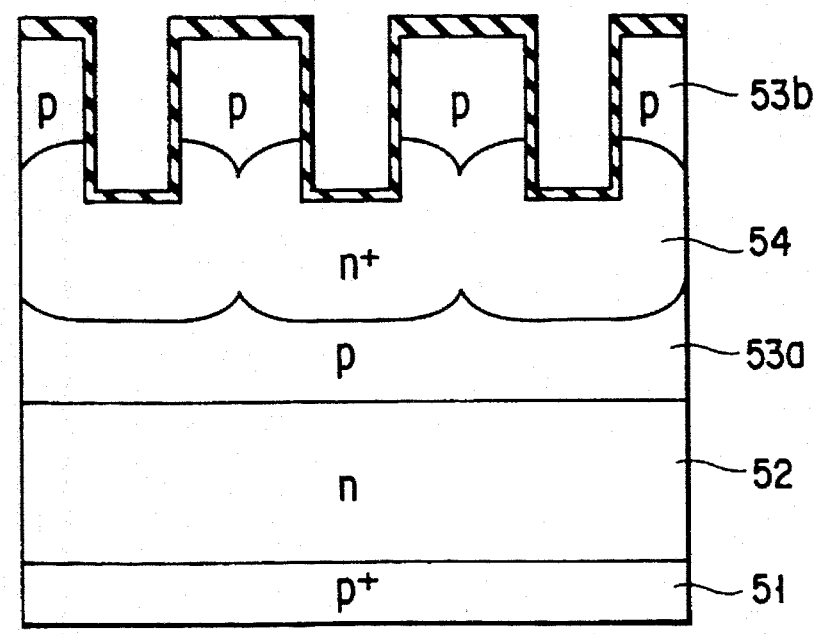

Next, as shown in FIG. 24C, n-type impurity ions NI are implanted into only the bottom of the vertical groove 66. At this time, it is desirable to prevent n-type impurity ions from being implanted into the sidewalls of the vertical groove portion 66 by providing a mask layer on the sidewalls of the groove 66. After the ion implantation, annealing and drive-in diffusion are effected as shown in FIG. 24D, in order to form an n-emitter layer 54 directly under the vertical groove 66. At this time, n-type impurities diffuse not only laterally but also upward and consequently takes such a form as encloses the vertical groove portion 66. As a result, the p-base layer 53 is separated by the n-emitter layer 54 into the upper and the lower layers 53a and 53b.

Figure 24E:
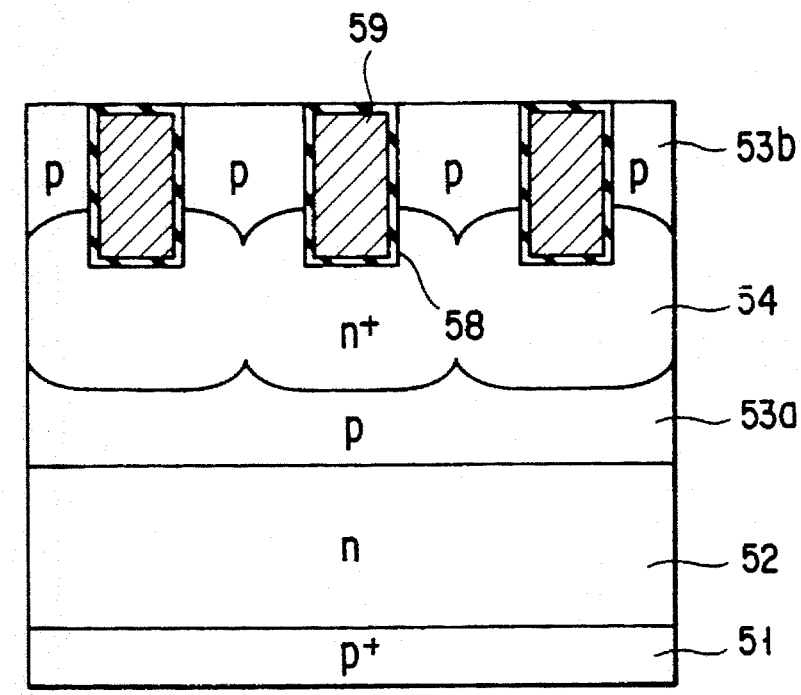

Next, the oxide film formed inside the vertical groove 66 during the diffusion process is etched away, and the overall surface of the semiconductor substrate including the inside of the vertical groove 66 is washed to remove impurity ions. After this, as shown in FIG. 24E, a gate insulating film 58 is formed on the inside walls of the vertical groove 66. Then, a gate electrode material 59 such as polysilicon is shaped so as to fill the inside of the vertical groove via the gate insulating film 58. Next, the gate electrode 59 and the insulating film 58 except for those in the vertical groove 66 are all etched away.

Figure 24F:
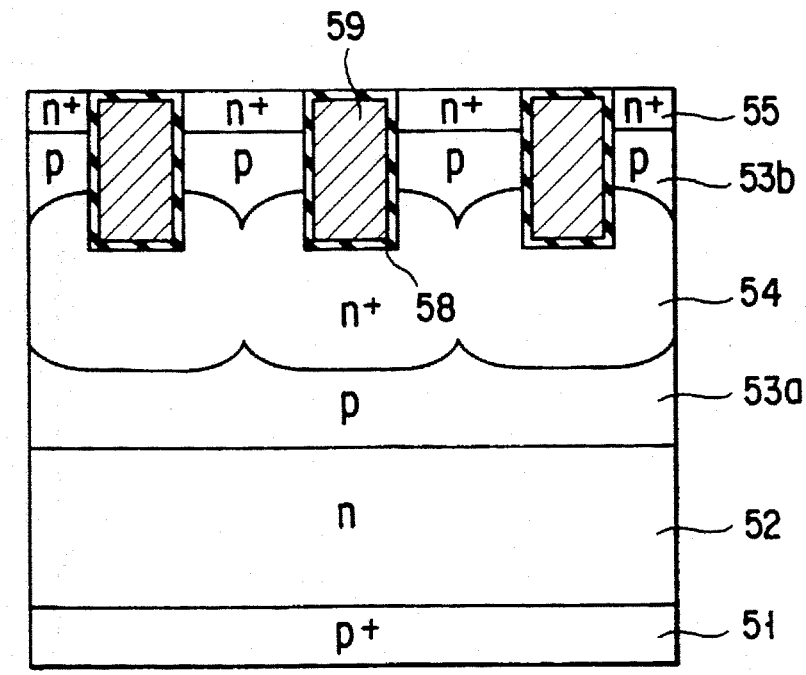

Next, as shown in FIG. 24F, using a resist layer as a mask, n-type impurity ions are implanted and diffused to form an n-source layer 55. Finally, as shown in FIG. 23, an interlayer insulating film is formed on the surface of the semiconductor substrate, and a contact hole is made in part of the insulating film. A cathode electrode 57 is formed so as to be in contact with the n-source layer 55 through the contact hole by a low-resistance. On the other hand, an anode electrode 56 is formed on the bottom surface of the substrate so as to be in contact with the p-emitter layer 51 by a low-resistance, thereby completing an insulated-gate turn-off thyristor.

Figure 25A:
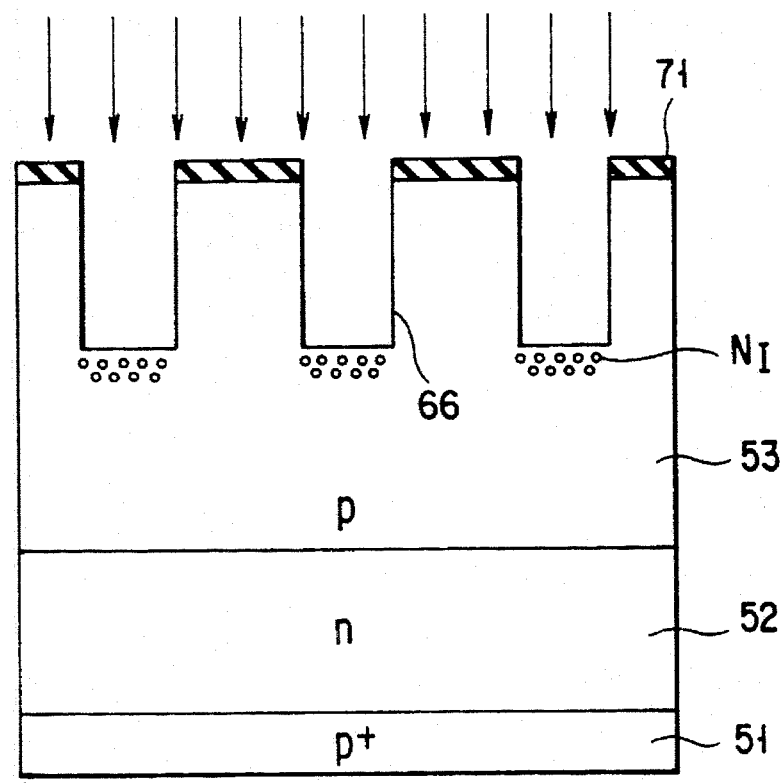
FIGS. 25A to 25D are sectional views for explaining another manufacturing process for the thyristor of FIG. 23.
Figure 25B:
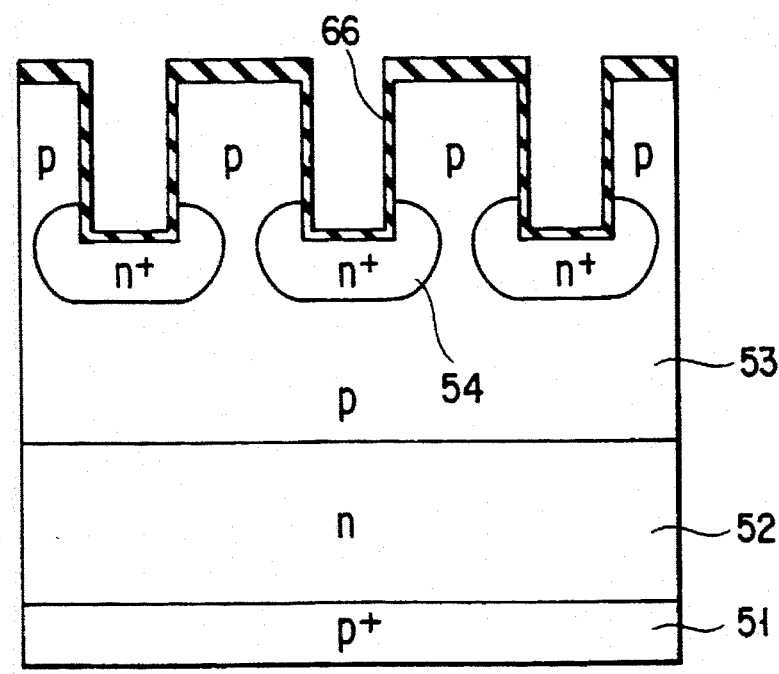
Figure 25C:
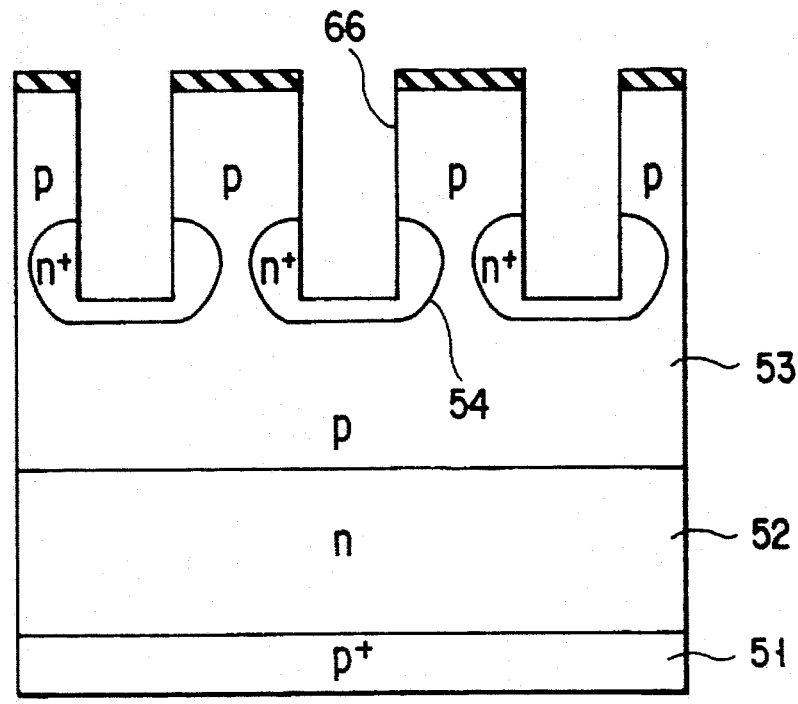

Now, a second method of forming the n-emitter layer 54 will be described with reference to FIGS. 25A to 25D. First, as shown in FIG. 25A, using a patterned oxide film or the like as a mask layer 71, the vertical groove portion (trench) 66 is selectively formed in the surface of the p-base layer 53 by dry etching techniques such as RIE. After n-type impurity ions are implanted into only the bottom of the vertical groove 66, annealing and drive-in diffusion are effected to form the n-emitter layer 54 directly under the vertical groove 66. All these processes are the same as those in FIGS. 24A to 24D (FIGS. 25A and 25B).

Figure 25D:
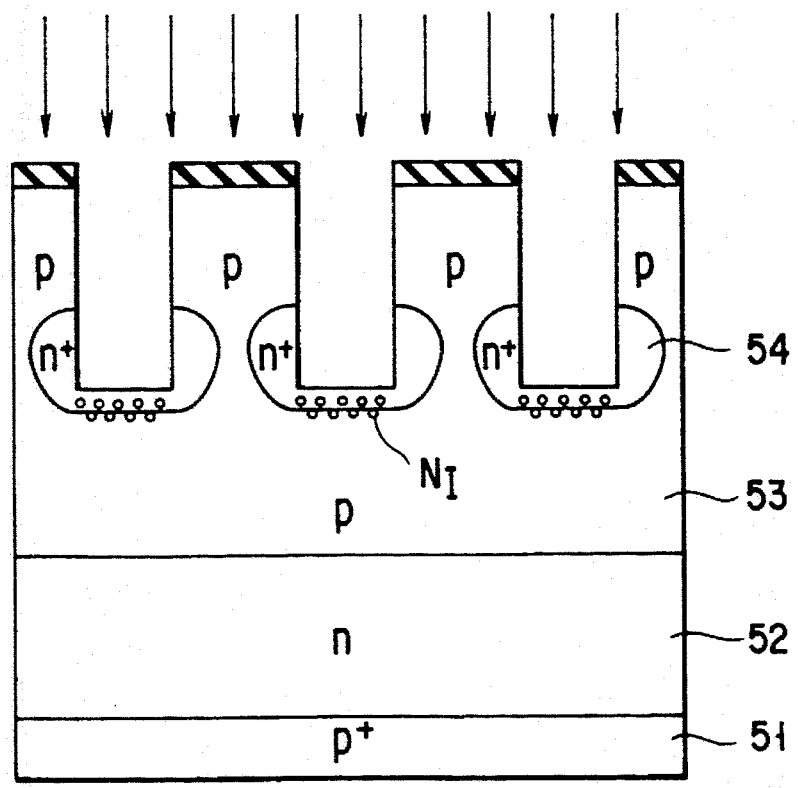

Next, as shown in FIG. 25C, by etching again using the same mask layer as the mask layer 71 used in forming the vertical groove 66, the vertical groove 66 is made much deeper with the same width as that of the above vertical groove 66. Then, as shown in FIG. 25D, n-type impurity ions are implanted into only the bottom of the vertical groove 66 as mentioned earlier. Then, annealing and drive-in diffusion are effected to form an n-emitter layer 54 directly under the vertical groove 6. By the above method, the n-emitter layer 54 with a specified depth can be formed reliably in the p-base layer of the sidewalls of the vertical groove 66.

The operation of the insulated-gate turn-off thyristor of FIG. 23 is as follows. When a positive voltage is applied to the gate electrode 59, the channel region becomes conductive. This allows electrons to flow from the cathode electrode through the n-source layer 55 and the channel region into the n-emitter layer 54. Then, these electrons are injected from the n-emitter layer 54 into a thyristor structure at a high injection efficiency, thereby turning on the device at a high speed. On the other hand, when a negative voltage is applied to the gate electrode 59, the channel region is placed in a nonconductive state, and consequently the supply of electrons to the n-emitter layer 54 is stopped, thus turning off the device. A method of discharging holes in turning off will be described later.

In this embodiment, as shown in FIG. 23, since the channel region is provided just above the n-emitter layer 54, the channel width per unit area increases, which not only reduces the channel resistance but also increase the area efficiency of the n-emitter layer 54, thereby improving the current density.

FIGS. 26 and 27 are sectional views of device structures of modifications of the insulated-gate turn-off thyristor shown in FIG. 23. In either figure, by selectively forming the n-source layer 55 along the cross section of the vertical groove portion, the n-source layer 55 is short-circuited with the p-base layer 53 through the cathode electrode 57, thus forming a hole-discharging path. In FIG. 27, the p-base layer 53a and the p-base layer 53b are connected to each other at the peripheral portion of the device.

FIG. 28A is a sectional view of a device of another modification of the insulated-gate turn-off thyristor of FIG. 23, and FIG. 28B shows its equivalent circuit. This arrangement is obtained by adding a hole bypass structure to the device structure of FIG. 23. By selectively forming an n-emitter layer 54 and an n-source layer 55 in a longitudinal direction of the vertical groove 66 or the gate electrode 59, a short-circuited portion between the n-source layer 55 and the p-base layer 53b is formed to build a hole-discharging path. Although the operation of the device is similar to that of the device structure of FIG. 23, holes, when the device is turned off, are discharged to the cathode electrode, passing through the p-base layer 53a directly under the n-emitter layer 54 and the high-concentration p-layer 64. With this structure, unlike the conventional device structure of FIG. 31, since holes do not pass through the p-base layer 53b directly under the n-source layer 55, it never happens that the injection of electrons cannot be stopped because a diode consisting of the n-source layer 55 and the p-base layer 53b is forward biased.

FIG. 29A is a sectional view of a device of still another modification of the insulated-gate turn-off thyristor of FIG. 23, and FIG. 29B shows its equivalent circuit. As in FIG. 23, a first gate electrode 60 is provided in a first vertical groove, and an n-channel MOSFET connected in series with the main thyristor is composed of an n-source layer 55, a p-base layer 53b, and an n-emitter layer 54. Further, aside from the first vertical groove, a second vertical groove 67 is formed which penetrates the lateral diffusion portion of the n-emitter layer 54 and has a depth reaching the p-base layer 53a. In the second vertical groove, a second gate electrode 61 is provided to form a p-channel MOSFET consisting of the p-base layer 53b, the n-emitter layer 54, and the p-base layer 53a. In this p-channel MOS-FET, when the device is turned off, a negative voltage is applied to the second gate electrode 61 to make the channel conductive, thereby providing a hole-discharging path.

Figure 30A:
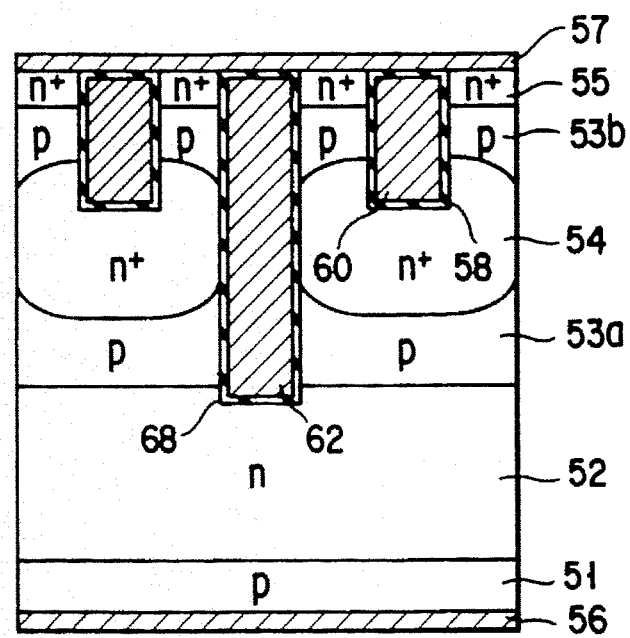
FIGS. 30A and 30B are a sectional view and an equivalent circuit of another modification of the thyristor of FIG. 23, respectively.
Figure 30B:
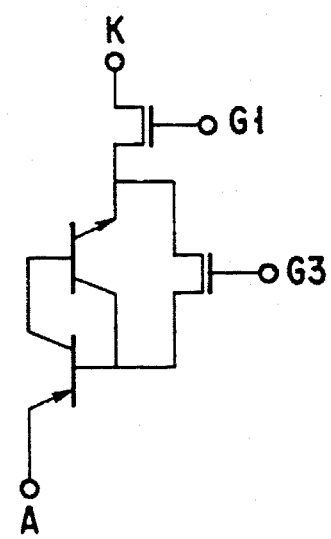

FIG. 30A is a sectional view of a device of still another modification of the insulated-gate turn-off thyristor of FIG. 23, and FIG. 30B shows its equivalent circuit. As in FIG. 23, a first gate electrode is provided in a first vertical groove, and an n-channel MOSFET connected in series with the main thyristor is composed of an n-source layer 55, a p-base layer 53b, and an n-emitter layer 54. Further, aside from the first vertical groove, a third vertical groove 68 is formed which penetrates the lateral diffusion portion of the n-emitter layer 54 and the p-base layer 53a and has a depth reaching the n-base layer 52. In the third vertical groove, a third gate electrode 62 is provided to form a p-channel MOSFET consisting of the n-emitter layer 54, the p-base layer 53a, and the n-base layer 52.

To turn on the device of FIG. 30A, a positive voltage is applied to the third gate electrode 62 to make the channel region of the n-channel MOSFET conductive, which causes electrons to be injected directly from the n-emitter layer 54 into the n-base layer 52, thereby turning on the device at a high speed.

The device structures in FIGS. 29A and 30A can be combined with each other. In this case, the operation is as follows. When a positive voltage is applied to all of the first, second, and third gate electrodes, the first and third channel regions become conductive, which causes the device to turn on at a high speed and at the same time, makes the second channel region nonconductive, thus eliminating the emitter short-circuited portion. As a result, electrons are injected from the n-emitter layer 54 into the thyristor structure at a high injection efficiency. On the other hand, when a negative voltage is applied to all of the first, second, and third gate electrodes, the second channel region becomes conductive and the first and third channel regions become nonconductive. As a result, the supply of electrons to the n-emitter layer 54 is stopped, and at the same time, holes are discharged to the cathode electrode 57 through the second channel region, thereby causing the device to turn off.

With this composite structure, because a cathode short circuit is not formed in the on state, electrons are injected from the n-emitter layer 54 at a high injection efficiency. Since the n-source layer 55 is formed above the n-emitter layer 54, a parasitic thyristor in which the n-source layer 55 acts as a parasitic n-emitter layer does not latch up.

As described above, with the fifth embodiment, an insulated-gate turn-off thyristor having a vertical groove-type field-effect transistor structure can be formed without using epitaxial growth techniques. As a result, it is possible to realize a device which improves the electron injection efficiency, raises resistance to the latching up of a parasitic thyristor, and increases the channel width and the effective area of the n-emitter layer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power semiconductor device comprising:

an emitter layer of a first conductivity type;

a base layer of a second conductivity type formed so as to be in contact with said emitter layer of said first conductivity type;

a low-resistance layer of said second conductivity type formed above said base layer of said second conductivity type and not in contact with said emitter layer of said first conductivity type, said low-resistance layer having a higher carrier concentration than that of said base layer of said second conductivity type;

an intermediate layer of said first conductivity type formed in a surface of said low-resistance layer of said second conductivity type;

a source layer of said second conductivity type formed in a surface of said intermediate layer of said first conductivity type;

a plurality of trenches formed in said low-resistance layer of said second conductivity type such that a side of each of said trenches is in contact with said intermediate layer of said first conductivity type and said source layer of said second conductivity type;

a gate electrode arranged within each of said trenches via a gate insulating film;

a first main electrode connected to said emitter layer of said first conductivity type; and a second main electrode connected to said source layer of said second conductivity type, wherein said low-resistance layer surrounds bottom portions of said trenches so as to completely separate said intermediate layer of said first conductivity type from said base layer of said second conductivity type.

2. The device according to claim 1, wherein said second main electrode is arranged to short-circuit said source layer of said second conductivity-type with said intermediate layer of said first conductivity-type.

3. The device according to claim 1, wherein said source layer of said second conductivity-type comprises a plurality of source layer portions separated from each other.

4. The device according to claim 3, wherein said intermediate layer of said first conductivity-type is in contact with said second main electrode between adjacent ones of said source layer portions such that said source layer portions and said base layer of said first conductivity-type are short-circuited.

5. The device according to claim 2, wherein a base layer of said first conductivity type is formed between said base layer of said second conductivity type and said low-resistance layer of said second conductivity type and is completely separated from said intermediate layer of said first conductivity type via said low-resistance layer of said second conductivity type, and wherein said device is operable as a thyristor.

6. The device according to claim 5, further comprising a MOSFET so as to selectively induce a channel of said first conductivity-type in said low-resistance layer of said second conductivity-type for connecting said base layer of said first conductivity-type and said intermediate layer of said first conductivity-type, said MOSFET including a gate electrode arranged via a gate insulating film within a trench which is formed in said low resistance layer of said second conductivity-type.

7. The device according to claim 2, further comprising a MOSFET so as to selectively induce a channel of said second conductivity-type in said low-resistance layer of said second conductivity-type for connecting said base layer of said second conductivity-type to said source layer of said second conductivity-type, said MOSFET including a gate electrode arranged via a gate insulating film in a trench which is formed in said low-resistance layer of said second conductivity-type.

* * * * *